United States Patent
Yoshinaga

(10) Patent No.: US 10,554,021 B2
(45) Date of Patent: Feb. 4, 2020

(54) QUANTUM CASCADE LASER, LIGHT EMITTING DEVICE, METHOD FOR FABRICATING A SEMICONDUCTOR LASER

(71) Applicant: SUMITOMO ELECTRIC INDUSTRIES, LTD., Osaka (JP)

(72) Inventor: Hiroyuki Yoshinaga, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/006,708

(22) Filed: Jun. 12, 2018

(65) Prior Publication Data

US 2018/0366911 A1    Dec. 20, 2018

(30) Foreign Application Priority Data

Jun. 19, 2017    (JP) .................................. 2017-119596

(51) Int. Cl.
*H01S 5/34*        (2006.01)
*H01S 5/227*       (2006.01)
(Continued)

(52) U.S. Cl.
CPC .......... *H01S 5/3402* (2013.01); *H01S 5/0206* (2013.01); *H01S 5/02272* (2013.01);
(Continued)

(58) Field of Classification Search
CPC ... H01S 5/3401–3402; H01S 5/16–168; H01S 5/028–0288; H01S 5/22–24;
(Continued)

(56) References Cited

U.S. PATENT DOCUMENTS 4,751,710 A * 6/1988 Yamaguchi ........... H01S 5/0264
372/44.01
5,180,685 A * 1/1993 Yamamoto .......... H01L 33/0062
148/DIG. 72
(Continued)

FOREIGN PATENT DOCUMENTS

DE    102008045980         6/2010
DE    102008045980 A1 *   6/2010    ............. B82Y 20/00
(Continued)

OTHER PUBLICATIONS

Manijeh Razeghi, "High-Performance InP-Based Mid-IR Quantum Cascade Lasers", *IEEE Journal of Selected Topics in Quantum Electronics*, vol. 15, No. 3, p. 941-p. 951, May/Jun. 2009.
(Continued)

*Primary Examiner* — Joshua King
(74) *Attorney, Agent, or Firm* — Smith, Gambrell & Russell, LLP.

(57) ABSTRACT

A quantum cascade laser includes: a laser structure having a first region, a second region, and a third region, the first region having an end face; a high-specific resistance region on principal surfaces of the first and second regions; a metal layer on a principal surface of the third region; a dielectric film on the end face and the high-specific resistance region; and a reflective metal film on the dielectric film, the end face and the high-specific resistance region. The first to third regions are arranged in a direction of a first axis. The laser structure has a semiconductor mesa and a semiconductor base that mounts the semiconductor mesa. The high-specific resistance region has a wall or terrace providing a difference in level at a boundary between the first and second regions, the wall or terrace extending in a direction of a second axis intersecting that of the first axis.

10 Claims, 17 Drawing Sheets

(51) Int. Cl.
*H01S 5/343* (2006.01)
*H01S 5/042* (2006.01)
*H01S 5/10* (2006.01)
*H01S 5/02* (2006.01)
*H01S 5/022* (2006.01)
*H01S 5/028* (2006.01)

(52) U.S. Cl.
CPC .......... *H01S 5/0421* (2013.01); *H01S 5/1039* (2013.01); *H01S 5/227* (2013.01); *H01S 5/343* (2013.01); *H01S 5/0282* (2013.01); *H01S 5/0425* (2013.01); *H01S 2301/176* (2013.01)

(58) Field of Classification Search
CPC ... H01S 5/02236–02276; H01S 5/0226; H01S 5/02272; H01S 5/02469; H01S 5/02484; H01S 5/02476; H01S 5/02492
See application file for complete search history.

(56) References Cited

U.S. PATENT DOCUMENTS

| | | | | |
|---|---|---|---|---|
| 5,677,922 A * | 10/1997 | Hayafuji | ............... | B82Y 20/00 372/46.01 |
| 5,943,553 A * | 8/1999 | Spaeth | ............... | H01L 33/641 372/107 |
| 6,289,030 B1 * | 9/2001 | Charles | ............... | H01L 31/02161 257/437 |
| 6,326,646 B1 * | 12/2001 | Baillargeon | ........... | B82Y 20/00 257/94 |
| 6,355,505 B1 | 3/2002 | Maeda et al. | | |
| 6,647,047 B2 * | 11/2003 | Yokota | ............... | H01S 5/0281 372/49.01 |
| 6,710,375 B2 * | 3/2004 | Oshima | ............... | H01S 5/0281 257/21 |
| 9,184,563 B1 * | 11/2015 | Raring | ............... | H01S 5/2201 |
| 2003/0035453 A1 * | 2/2003 | Fitz | ............... | H01S 5/028 372/49.01 |
| 2004/0101013 A1 * | 5/2004 | Yokota | ............... | H01S 5/028 372/46.013 |
| 2004/0233950 A1 * | 11/2004 | Furukawa | ............... | H01S 5/028 372/43.01 |
| 2004/0238810 A1 | 12/2004 | Dwilinski et al. | | |
| 2005/0151150 A1 * | 7/2005 | Choi | ............... | H01S 5/0425 257/99 |
| 2006/0239321 A1 * | 10/2006 | Kume | ............... | B82Y 20/00 372/50.121 |
| 2006/0274804 A1 * | 12/2006 | Behfar | ............... | H01S 5/028 372/49.01 |
| 2009/0067464 A1 * | 3/2009 | Tanaka | ............... | B82Y 20/00 372/45.011 |
| 2009/0086782 A1 | 4/2009 | Yokoyama et al. | | |
| 2011/0158275 A1 * | 6/2011 | Yoshizumi | ............ | H01S 5/3202 372/44.011 |
| 2013/0028280 A1 * | 1/2013 | Hongo | ............... | H01S 5/02461 372/44.01 |
| 2013/0107534 A1 * | 5/2013 | Avramescu | ......... | H01S 5/02461 362/259 |
| 2013/0250994 A1 | 9/2013 | Moenster et al. | | |
| 2013/0301666 A1 * | 11/2013 | Stagarescu | ............ | H01S 5/3013 372/44.01 |
| 2013/0322480 A1 * | 12/2013 | Edamura | ............ | H01S 5/3401 372/45.01 |
| 2014/0211819 A1 * | 7/2014 | Yoshida | ............ | H01S 5/02272 372/36 |
| 2014/0239250 A1 * | 8/2014 | Fang | ............... | H01L 33/06 257/13 |
| 2015/0117484 A1 * | 4/2015 | Sugiyama | ............ | H01S 5/0285 372/45.01 |
| 2018/0069374 A1 | 3/2018 | Kakuno et al. | | |

FOREIGN PATENT DOCUMENTS

| | | | | |
|---|---|---|---|---|
| DE | 102015116335 | | 3/2017 | |
| DE | 102015116335 A1 * | | 3/2017 | ........... H01S 5/0421 |

OTHER PUBLICATIONS

S.R. Darvish, et al., "High-power, continuous-wave operation of distributed-feedback quantum-cascade lasers at $\lambda 7.8$ µm", *Applied Physics Letters*, 89, 251119 2006.

* cited by examiner

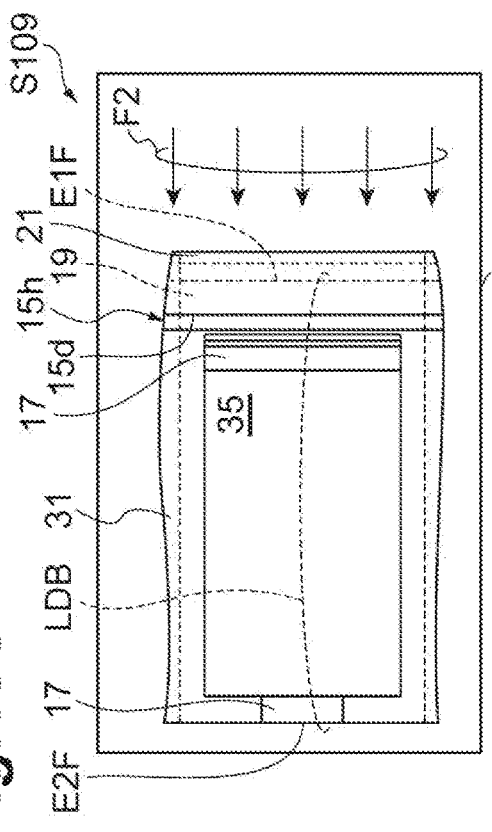
Fig.10C
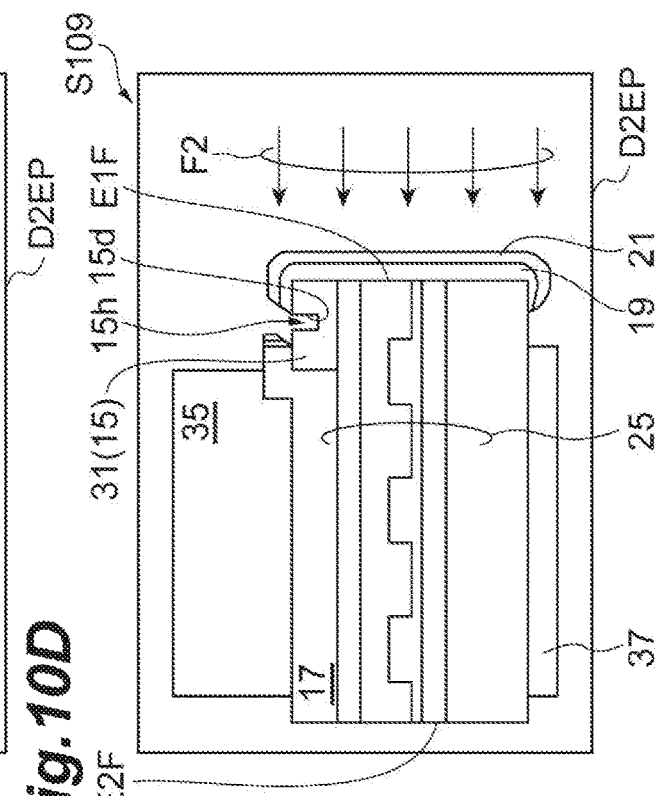
Fig.10D
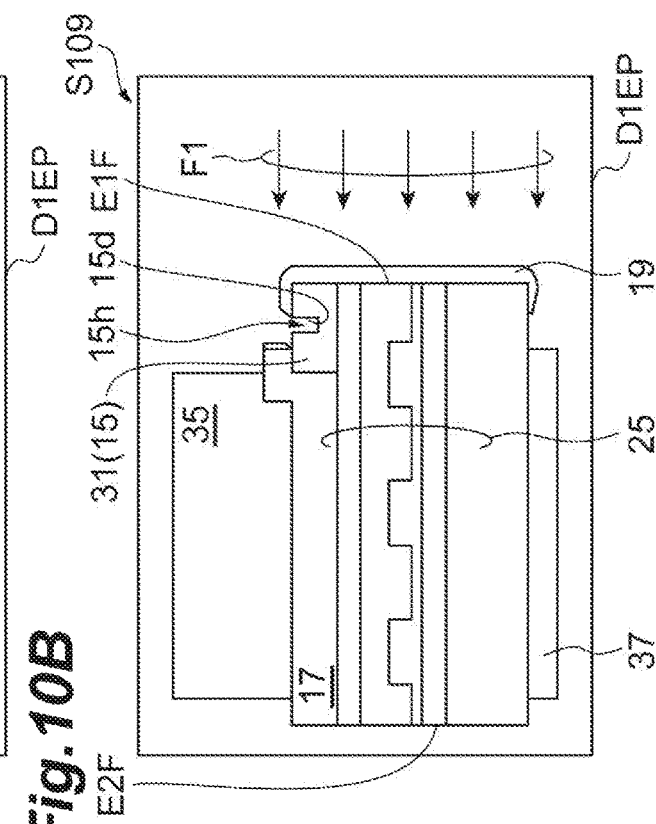
Fig.10A
Fig.10B

QUANTUM CASCADE LASER, LIGHT EMITTING DEVICE, METHOD FOR FABRICATING A SEMICONDUCTOR LASER

BACKGROUND OF THE INVENTION

Field of the Invention

The present invention relates to a quantum cascade laser, a light emitting device, and a method for fabricating a semiconductor laser. This application claims the benefit of priority from Japanese Patent Application No. 2017-119596 filed on Jun. 19, 2017, which is herein incorporated by reference in its entirety.

Related Background Art

Manijeh Razeghi, "High-Performance InP-Based Mid-IR Quantum Cascade Lasers," IEEE JOURNAL OF SELECTED TOPICS IN QUANTUM ELECTRONICS, VOL. 5, NO. 3, MAY/JUNE 2009 (referred to hereinafter as "Non-Patent Document 1") discloses a quantum cascade laser.

SUMMARY OF THE INVENTION

A quantum cascade laser according to one aspect of the present invention includes: a laser structure including a first region, a second region, and a third region, the first region having an end face; a high-specific resistance region disposed on a principal surface of the first region and a principal surface of the second region; a metal layer disposed on a principal surface of the third region; a dielectric film disposed on the end face and the high-specific resistance region; and a reflective metal film disposed on the dielectric film, the end face and the high-specific resistance region. The first region, the second region, and the third region are arranged in order in a direction of a first axis. The laser structure includes a semiconductor mesa and a semiconductor base. The semiconductor mesa has a core layer, and the semiconductor base mounts the semiconductor mesa. The dielectric film has a terrace with a difference in level at a boundary between the first region and the second region. The terrace extends in a direction of a second axis intersecting that of the first axis.

A light emitting apparatus according to another aspect of the present invention includes: a quantum cascade laser; a supporting base mounting the quantum cascade laser; and a solder material fixing the quantum cascade laser to supporting base. The quantum cascade laser includes: a laser structure including a first region, a second region, and a third region, the first region having an end face; a high-specific resistance region disposed on a principal surface of the first region and a principal surface of the second region; a metal layer disposed on a principal surface of the third region; a dielectric film disposed on the end face and the high-specific resistance region; and a reflective metal film disposed on the dielectric film, the end face and the high-specific resistance region. The first region, the second region, and the third region are arranged in order in a direction of a first axis. The laser structure includes a semiconductor mesa and a semiconductor base. The semiconductor mesa has a core layer, and the semiconductor base mounts the semiconductor mesa. The dielectric film has a terrace with a difference in level at a boundary between the first region and the second region. The terrace extends in a direction of a second axis intersecting that of the first axis.

A method for fabricating a quantum cascade laser according to still another aspect of the present invention includes: preparing a laser bar having an arrangement of device sections; supplying a flux of raw material for an dielectric insulator to an end face of the laser bar to deposit dielectric insulator on the end face; and after supplying the flux for the dielectric insulator, supplying a flux of raw material for a metal reflective film to the end face of the laser bar to deposit the metal reflective film on the end face. The laser bar includes a laser structure and a high-specific resistance region, and the laser structure has a first region, a second region, a third region, and a terrace. The first region has the end face, and the high-specific resistance region is disposed on a principal surface of the first region. Each of the device sections includes a metal layer disposed on the third region. The first region, the second region, and the third region are arranged in order in a direction of a first axis and extend in a direction of a second axis intersecting that of the first axis. The terrace extends on a boundary between the second region and the third region in the direction of the second axis.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 10A is a schematic view showing a major step in the methods according to the embodiment.

FIG. 10B is a schematic view showing a major step in the methods according to the embodiment.

FIG. 10C is a schematic view showing a major step in the methods according to the embodiment.

FIG. 10D is a schematic view showing a major step in the methods according to the embodiment.

DESCRIPTION OF THE EMBODIMENTS

Figure 1:
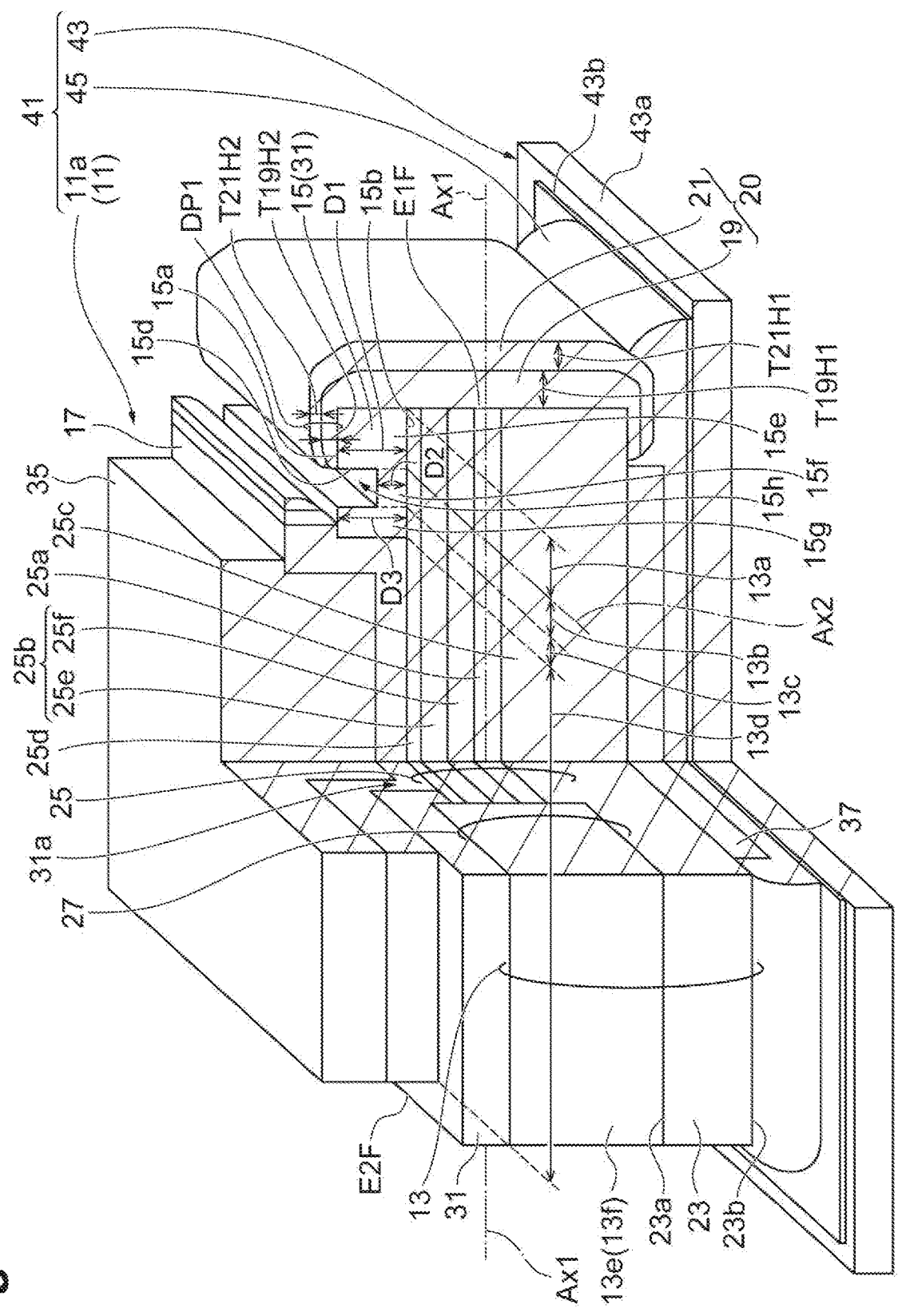
FIG. 1 is a partially cutaway schematic view showing a semiconductor laser and a light emitting device according to one embodiment.

A quantum cascade laser has a reflection film on the end face thereof, and the reflection film is disposed on the end faces of conductive semiconductor layers for the quantum cascade laser. The reflective film on the end face includes a metal film enabling high reflectance. Disposing the metal film directly on the end face causes the conductive semiconductor layers to short-circuit at the end face. In order to avoid this short circuit, a dielectric film can be grown to form a composite film prior to the growth of the metal film. The composite film includes the metal film and the dielectric film underlying the metal film, and the underlying dielectric film can prevent the conductive semiconductor layers on the end face from short-circuiting through the metal film. The composite film is disposed on the end face of the laser bar. The inventor's findings reveal that some of the quantum cascade lasers, each of which has a composite film on the face, exhibit leakage current from the beginning, and that others start to show an increasing leakage current during the operation. The inventor's observations show that short-circuiting may increase the leakage current in the quantum cascade laser.

It is an object of one aspect of the present invention to provide a quantum cascade laser having a structure that can avoid short-circuits caused by a metal reflective film on the end face thereof. It is an object of another aspect of the present invention to provide a light-emitting apparatus that includes the quantum cascade laser. It is an object of still another aspect of the present invention to provide a method for fabricating a quantum cascade laser having a structure that can avoid short-circuits caused by a metal reflective film on the end face thereof.

Embodiments according to the present above aspects will be described below.

A quantum cascade laser according to an embodiment includes: (a) a laser structure including a first region, a second region, and a third region, the first region having an end face; (b) a high-specific resistance region disposed on a principal surface of the first region and a principal surface of the second region; (c) a metal layer disposed on a principal surface of the third region; (d) a dielectric film disposed on the end face and the high-specific resistance region; and (e) a reflective metal film disposed on the dielectric film, the end face and the high-specific resistance region. The first region, the second region, and the third region are arranged in order in a direction of a first axis. The laser structure includes a semiconductor mesa and a semiconductor base. The semiconductor mesa has a core layer, and the semiconductor base mounts the semiconductor mesa. The dielectric film has a terrace with a difference in level at a boundary between the first region and the second region. The terrace extends in a direction of a second axis intersecting that of the first axis.

The quantum cascade laser has the dielectric film and the metal reflective film on the end face of the laser structure. The order of processes for forming the dielectric film and the metal reflective film allows the formation of the metal reflective film on the dielectric film. Some of flux of raw material for the dielectric film is deposited on the end face of the laser structure, and others miss the end face to fly along the upper and lower faces of the laser structure, thereby depositing on the high specific resistance region on the first region. Similarly, flux of raw material for the metal reflecting film is also deposited on the end face of the laser structure, and miss the end face to fly along the upper and lower faces of the laser structure to form the high specific resistance region on the first region and deposited material associated with the dielectric film. Inventor's observations show that the deposited material of the dielectric film has a thickness on the principal face of the first region thinner than on the end face of the laser structure and has a variation in thickness. On the principal surface of the first region, the dielectric film and the metal reflective film is disposed on the high specific resistance region, and is terminated by the upper edge of the terrace, which extends in the direction of the second axis intersecting that of the first axis. The high specific resistance region reliably spaces the laser structure from the metal reflective film.

In the quantum cascade laser according to an embodiment, the laser structure further includes a fourth region, the first region, the second region, the third region, and the fourth region are arranged in order in the direction of the first axis; the dielectric film has an inorganic insulating film on the laser structure; the inorganic insulating layer has a strip-shaped opening on the semiconductor mesa and a principal surface of the fourth region; and the metal film is in contact with the fourth region through the strip-shaped opening.

The quantum cascade laser allows the electrical connection of the metal layer to the fourth region of the laser structure via the strip-shaped opening of the inorganic insulating layer.

In the quantum cascade laser according to an embodiment, the inorganic insulating film is disposed on the principal surface of the first region, the second region, and the third region; the inorganic insulating film has a first portion and a second portion arranged in the direction of the first axis; the first portion and the second portion of the inorganic insulating film are disposed on the principal surfaces of the first region and the second region, respectively; the first portion of the inorganic insulating film has a first thickness; the second portion of the inorganic insulating film has a second thickness different from the first thickness; and the first portion and the second portion of the inorganic insulating film are adjoined to each other to form the terrace.

The quantum cascade laser may provide the high specific resistance region with a difference in level of the inorganic insulating layer between the first part of the first thickness and the second part of the second thickness.

In the quantum cascade laser according to an embodiment, the inorganic insulating film further has a third portion on the principal surface of the third region, the first portion, the second portion and the third portion of the inorganic insulating layer extend in the direction of the second axis; the third portion of the inorganic insulating film has a third thickness different from the second thickness; and the second portion and the third portion of the inorganic insulating film are adjoined to each other to form a groove.

The quantum cascade laser may provide the inorganic insulating layer with the first, second and third parts which are arranged to form a groove, which brings the high specific resistance region a terrace.

In the quantum cascade laser according to an embodiment, the high-specific resistance region further includes a high-specific resistance semiconductor layer, the inorganic insulating layer is disposed between the laser structure and the high-specific resistance semiconductor layer; the inorganic insulating layer has an edge extending on the high-specific resistance semiconductor layer; and the difference in level is formed by the edge of the inorganic insulating layer.

The quantum cascade laser may provide the high specific resistance region with the inorganic insulating film and the high resistivity semiconductor layer, and the inorganic insulating layer has an edge which extends on the high resistivity semiconductor layer so as to form the difference in level in the high specific resistance region.

In the quantum cascade laser according to an embodiment, the high-specific resistance semiconductor layer is disposed on the principal surface of the first region, the second region and the third region; and the high-specific resistance semiconductor layer is in contact with the metal layer through the strip-shaped opening.

The quantum cascade laser allows the high resistivity semiconductor layer to make contact with the metal layer in the strip-shaped opening in the third region and to extend on the principal surface of the first and second regions to form the terrace.

In the quantum cascade laser according to an embodiment, the high-specific resistance semiconductor layer includes at least one of semi-insulating or undoped semiconductors.

The quantum cascade laser provides the high resistivity semiconductor layer with semi-insulating or undoped semiconductor which enables high resistivity.

In the quantum cascade laser according to an embodiment, the inorganic insulating layer is in contact with the first region, the second region, and the third region.

The quantum cascade laser allows the inorganic insulating layer to make contact with the first to third regions of the laser structure, thereby spacing the metal reflective film from the laser structure.

A light emitting apparatus according to an embodiment includes: (a) a quantum cascade laser; (b) a supporting base mounting the quantum cascade laser; and (c) a solder material fixing the quantum cascade laser to supporting base. The quantum cascade laser includes: a laser structure including a first region, a second region, and a third region, the first region having an end face; a high-specific resistance region disposed on a principal surface of the first region and a principal surface of the second region; a metal layer disposed on a principal surface of the third region; a dielectric film disposed on the end face and the high-specific resistance region; and a reflective metal film disposed on the dielectric film, the end face and the high-specific resistance region. The first region, the second region, and the third region are arranged in order in a direction of a first axis. The laser structure includes a semiconductor mesa and a semiconductor base. The semiconductor mesa has a core layer, and the semiconductor base mounts the semiconductor mesa. The dielectric film has a terrace with a difference in level at a boundary between the first region and the second region. The terrace extends in a direction of a second axis intersecting that of the first axis.

In this light emitting device, the quantum cascade laser has the dielectric film and the metal film on the end face of the laser structure. The order of processes for forming the dielectric film and forming the metal reflective film allows the dielectric film to be under the metal reflective film. Inventor's findings show that flux of material for the dielectric film forms deposited material on the end face of the laser structure and misses the end face of the laser structure to fly along the side faces of the laser structure to form deposited material on the high specific resistance region on the first region, and that flux of material for the metal reflective film, similarly, flies along the side faces of the laser structure to form deposited material on the high specific resistance region on the first region in addition to the end face of the laser structure during film formation. Inventor's Observations show that the deposited material for the dielectric film on the high specific resistance region on the first region has a thickness smaller than that of the dielectric film on the end face of the laser structure. The high specific resistance region on the laser structure can insulate the metal reflective film on the dielectric film from semiconductor of the laser structure. The difference in level of the laser structure makes it possible to separate the metal reflective film on the high specific resistance region from the metal layer.

A method for fabricating a quantum cascade laser according to an embodiment includes: (a) preparing a laser bar having an arrangement of device sections; (b) supplying a flux of raw material for an dielectric insulator to an end face of the laser bar to deposit dielectric insulator on the end face; and (c) after supplying the flux for the dielectric insulator, supplying a flux of raw material for a metal reflective film to the end face of the laser bar to deposit the metal reflective film on the end face. The laser bar includes a laser structure and a high-specific resistance region, and the laser structure has a first region, a second region, a third region, and a terrace. The first region has the end face, and the high-specific resistance region is disposed on a principal surface of the first region. Each of the device sections includes a metal layer disposed on the third region. The first region, the second region, and the third region are arranged in order in a direction of a first axis and extend in a direction of a second axis intersecting that of the first axis. The terrace extends on a boundary between the second region and the third region in the direction of the second axis.

The method for fabricating a semiconductor laser includes a process for forming the dielectric film and the metal film on the end face of the laser bar. Flux of raw material for the dielectric film flies along the sides of the laser bar to form deposited material on the high specific resistance region on the first region in addition to on the end face of the laser bar during film formation. Similarly, flux of raw material for the metal reflective film flies along the sides of the laser bar to form deposited material on the high specific resistance region on the first region in addition to on the end face of the laser bar during film formation. The order of processes for forming the dielectric film and the metal reflective film allows the dielectric film to be under the metal reflective film. Inventor's Observations reveal that deposited material for the dielectric film on the side face of the difference in level on the high specific resistance region has a thickness smaller than that on the end face of the laser bar and the step on the first region. The high specific resistance region on the laser bar, however, can space the metal reflective film on the dielectric film from semiconductor of the laser structure. The difference in level of the laser bar allows the metal reflective film on the high specific resistance region to be apart from the metal layer.

The teachings of the present invention can be readily understood by considering the following detailed description with reference to the accompanying drawings shown as examples. Referring to the accompanying drawings, embodiments according to a quantum cascade laser, a light emitting apparatus, and a method for fabricating quantum cascade laser will be illustrated below. When possible, the same portions will be denoted by the same reference numerals.

Figure 2:
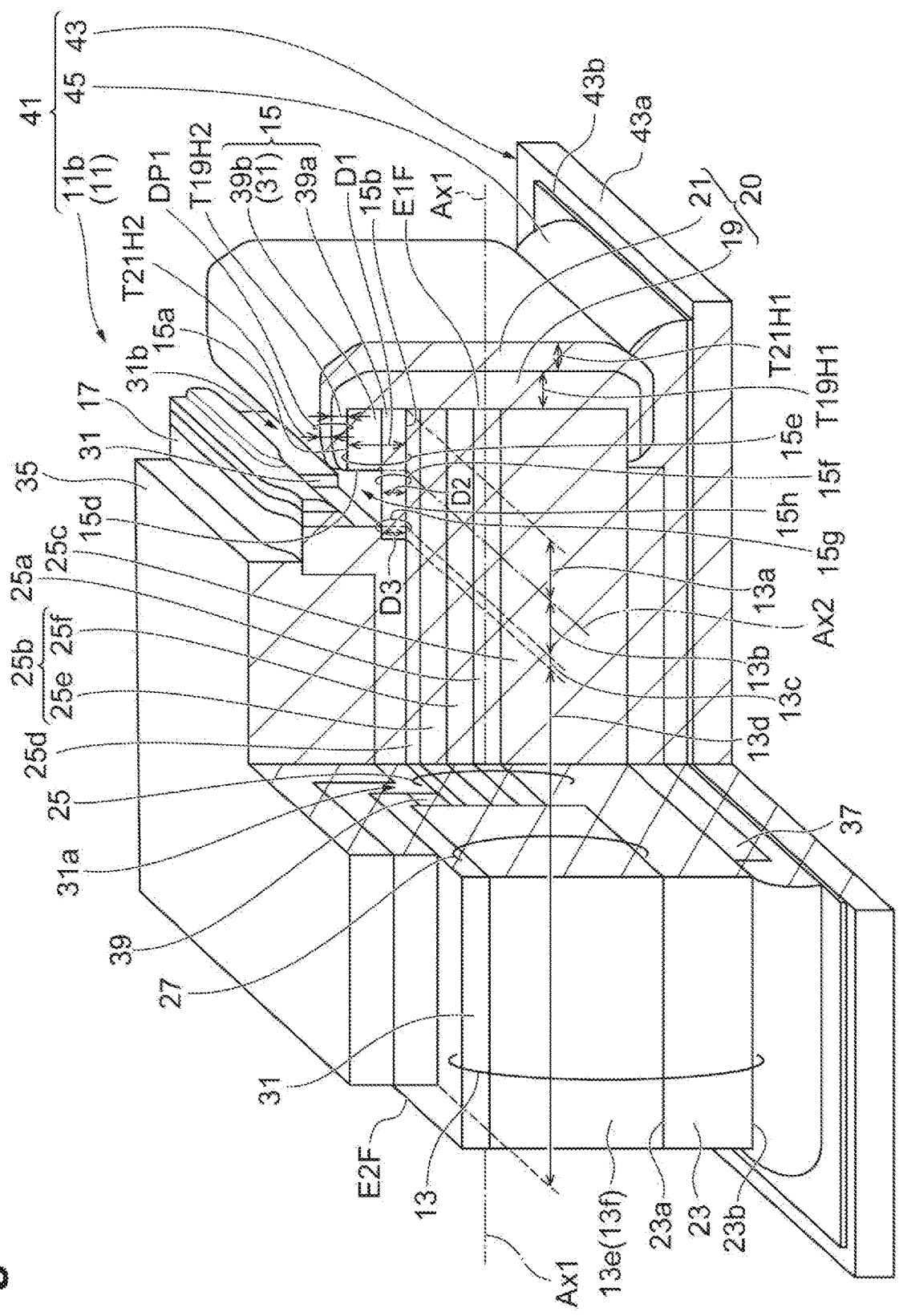
FIG. 2 is a partially cutaway schematic view showing a semiconductor laser and a light emitting device according to another embodiment.

FIG. 1 is a partially cutaway schematic view showing a semiconductor laser according to the present embodiment. FIG. 2 is a partially cutaway schematic view showing the semiconductor laser according to the embodiment. Referring to FIGS. 1 and 2, a quantum cascade laser 11 (11a and 11b) is shown as an illustration of a semiconductor laser. The quantum cascade laser 11 includes a laser structure 13, a high specific resistance region 15, a metal layer 17, a dielectric film 19, and a metal reflective film 21. The laser structure 13 has a first region 13a, a second region 13b and a third region 13c, which are sequentially arranged in the direction of the first axis Ax1. The laser structure 13 includes a first end face E1F and a second end face E2F, and the first end face E1F is on the back side of the second end face E2F. The first region 13a includes the first end face E1F. The high specific resistance region 15 is disposed on the first and second regions 13a and 13b of the laser structure 13, and may be disposed on the third region 13c. The metal layer 17 is disposed on the third region 13c of the laser structure 13. The dielectric film 19 is disposed on the first end face E1F and the high specific resistance region 15, and the metal reflective film 21 is disposed on the first end face E1F, the high specific resistance region 15 and the dielectric film 19. The laser structure 13 includes a semiconductor substrate 23 and a semiconductor mesa 25, and the semiconductor mesa 25 is mounted on the principal surface 23a of the semiconductor substrate 23. The semiconductor mesa 25 includes a core layer 25a, and specifically, further includes an upper semiconductor layer 25b, a lower semiconductor region 25c, and a contact layer 25d. The semiconductor mesa 25 extends in the direction of the first axis Ax1. In the present embodiment, the laser structure 13 further includes an embedding region 27, and the embedding region 27 embeds the semiconductor mesa 25. More specifically, the arrangement of the core layer 25a, the upper semiconductor layer 25b, the lower semiconductor region 25c, and the contact layer 25d and the embedding region 27 are disposed on the principal surface 23a of the semiconductor substrate 23.

The high specific resistance region 15 has a first face 15a second face 15b opposite to the first face 15a to form a terrace therebetween. The second face 15b is bonded to the epi-face of the first region 13a. The high specific resistance region terrace has a difference in level or "wall" 15d at the boundary between the first and second regions 13a and 13b. The difference in level (wall) 15d of the high specific resistance region 15 is disposed on the epi-face of the laser structure 13 and extends in the direction of the second axis Ax2 intersecting the direction of the first axis Ax1. The length of the difference in level 15d is larger than the width of the metal layer 17. Specifically, the terminal end of the difference in level 15d is located outside the side edge of the metal layer 17. In the present embodiment, the difference in level 15d reaches the side edges of the quantum cascade laser 11.

The quantum cascade laser 11 provides the dielectric film 19 and the metal reflective film 21 on the first end face E1F of the laser structure 13. The order of processes for forming the dielectric film 19 and the metal reflective film 21 is determined such that the dielectric film 19 is under the metal reflective film 21. Inventor's studies reveal that flux for the dielectric film 19 is deposited to form deposited material on the first end face E1F of the laser structure 13, and is also deposited on the high specific resistance region 15 on the first region 13a of the laser structure after flying along the side face of the laser bar (the upper and lower faces of the laser structure 13) during the film formation. Similarly, flux for the metal reflective film 21 is deposited to form deposited material on the first end face E1F of the laser structure 13, and also flies along the side faces of the laser bar before being deposited on the high specific resistance region 15 on the first region 13a.

The laser structure 13 further includes a fourth region 13d, and the first region 13a, the second region 13b, the third region 13c, and the fourth region 13d are sequentially arranged in the direction of the first axis Ax1. The fourth region 13d includes the second end face E2F.

Inventor's observations show that the deposited material for the dielectric film 19, which is formed on the high specific resistance region 15 on the epi-surface of the first and second regions 13a and 13b, has a thickness smaller than that of the dielectric film 19 on the one end face E1F and that the deposited material for the metal reflective film 21, which is formed on the deposited material for the dielectric film 19 and the high specific resistance region 15, has a thickness smaller than the metal reflective film 21 on the first end face E1F of the laser structure 13. Specifically, the thickness of the deposited material for the dielectric film 19 on the high specific resistance region 15 and the first region 13a is about 0.2 times that of the dielectric film 19 on the first end face E1F of the epi-surface of the laser structure 13. The thickness T19H2 of the deposited material for the dielectric film 19 on the first region 13a and the first face 15a of the high specific resistance region 15 is smaller than the thickness T19H1 of the dielectric film 19 on the first end face E1F. The thickness T21H2 of the metal reflective film 21 on the first face 15a of the high specific resistance region 15 is smaller than the thickness T21H1 of the metal reflective film 21 on the first end face E1F. The high specific resistance region 15 on the first region 13a can space the metal reflective film 21 on the dielectric film 19 from the semiconductor of the laser structure 13. The difference in level 15d of the high specific resistance region 15 makes it possible to separate the metal reflective film 21 on the high specific resistance region 15 from the metal layer.

The quantum cascade laser 11 may further have a passivation film 31 on the semiconductor mesa 25 and the embedding region 27. The passivation film 31 has a strip-shaped opening 31a extending on the upper face of the semiconductor mesa 25. The metal layer 17 makes contact with the upper face of the semiconductor mesa 25 through the strip-shaped opening 31a of the passivation film 31. The metal layer 17 is disposed on the third and fourth regions 13c and 13d, and makes contact with the fourth region 13d of the laser structure 13. In the present embodiment, the fourth region 13d extends from the high specific resistance region 15 on the third region 13c to the upper edge of the second end face E2F. The thick electrode 35 (the plated electrode) makes contact with the metal layer 17 on the fourth region 13d. If necessary, as in the embodiment, the thick electrode 35 can be apart from the upper edge of the second end face E2F. The quantum cascade laser 11 further has a backside metal layer 37 on the back face (the surface opposite to the epi-surface, e.g., the back face 23b of the semiconductor substrate 23) of the laser structure 13.

In the present embodiment, the high specific resistance region 15 includes a passivation film 31. Specifically, the high specific resistance region 15 includes an inorganic insulating layer, which is disposed on the epi-surface of the laser structure 13. This inorganic insulating layer works as the passivation film 31 in the present embodiment. The inorganic insulating layer of the passivation film 31 has a strip-shaped opening 31a on the semiconductor mesa 25 in the fourth region 13d of the laser structure 13. The metal layer 17 is in direct contact with the fourth region 13d through the strip-shaped opening 31a of the inorganic insulating layer. Such an inorganic insulating layer can include, for example, silicon-based inorganic insulating material, and the silicon-based inorganic insulating material enables a desired insulating property to the inorganic insulating layer. The inorganic insulating layer is in direct contact with the first, second, and third regions 13a, 13b, and 13c, and can provide an insulating barrier to the epi-surface in the vicinity of the first end surface E1F.

In the present embodiment, the wall 15d of the high specific resistance region terrace extends in a direction from the upper edge of one side 13e of the pair of sides (13e and 13f) of the laser structure 13 toward the other side 13f, and specifically extends from the upper edge of one side 13e to the upper edge of the side face 13f. The wall or difference in level 15d defines a recess 15h with reference to the first face 15a on which deposited materials for the dielectric film 19 and the metal reflective film 21 are formed, and the recess 15h is located on the second region 13b. In the recess 15h, the high specific resistance region 15 extends on the semiconductor mesa 25 in the direction of the first axis Ax1 from the upper edge of the first end face E1F, and terminates at the boundary between the third and fourth regions 13c and 13d. The high specific resistance region 15 covers the epi-surfaces of the first and second regions 13a and 13b, and may further cover the epi-surface of the third region 13c.

The high specific resistance region 15 is less conductive than the semiconductor in the semiconductor mesa 25, and has high specific resistance. The high specific resistance region 15 includes a first portion 15e, a second portion 15f, and a third portion 15g. The first to third portions 15e to 15g are arranged in the direction of the first axis Ax1, and are disposed in the first to third regions 13a to 13c, respectively. The high specific resistance region 15 is less conductive than the semiconductor of the semiconductor substrate 23, and has high specific resistance. The high specific resistance region 15 may have an inorganic insulating film, such as a silicon-based inorganic insulator, and in the present embodiment, includes a SiON film.

(First Structure)

The quantum cascade laser 11a will be described with reference to FIG. 1. The high specific resistance region 15 includes at least one inorganic insulating layer, which may be in direct contact with the epi-surface of the laser structure 13. In the present embodiment, the inorganic insulating layer includes a silicon-based inorganic insulating film, such as SiON. The high specific resistance region 15 extends from the upper edge of one side face 13e of the laser structure 13 to the upper edge of the other side face 13f over the first, second and third regions 13a, 13b, and 13c.

The first and second portions 15e and 15f have a first thickness D1 and a second thickness D2, respectively. The second thickness D2 is different from the first thickness D1, and specifically, is smaller than the first thickness D1 in the present embodiment. The first and second portions 15e and 15f may be adjoined to each other to form the difference in level 15d. The difference in level 15d of the high specific resistance region 15 is provided by the first portion 15e of the first thickness D1 and the second portion 15f of the second thickness D2. Furthermore, the third portion 15g has a third thickness D3, which is different from the second thickness D2, and specifically, is greater than the second thickness D2 in the present embodiment. The first, second and third portions 15e, 15f, and 15g extend in the direction of the second axis Ax2, so that the arrangement of the first, second and third portions 15e, 15 f, and 15g forms a recess 15h (groove) extending in the direction of the second axis Ax2. The recess 15h can space the metal layer 17d from the metal reflective film 21.

(Second Structure)

The quantum cascade laser 11b will be described with reference to FIG. 2. The high specific resistance region 15 may include one or more high resistivity semiconductor layers 39a and one or more inorganic insulating layers 39b. Each inorganic insulating layer 39b may include a silicon-based inorganic insulating film, and each high resistivity semiconductor layer 39a may include a semi-insulating or undoped semiconductor. Semi-insulating and undoped semiconductors can enables high specific resistance in the high resistivity semiconductor layer 39a, and specifically, the high specific resistance semiconductor layer 39a may include, for example, Fe-doped InP and/or undoped InP. The inorganic insulating layer 39b may include a passivation film 31. The high resistivity semiconductor layer 39a is disposed between the inorganic insulating layer 39b and the epi-surface of the laser structure 13. The high resistivity semiconductor layer 39a is in direct contact with the epi-surfaces of the first, second and third regions 13a, 13b and 13c, and the inorganic insulating layer 39b is in direct contact with the high resistivity semiconductor layer 39a in the first region 13a. The inorganic insulating layer 39b has an edge extending in the direction of the second axis Ax2 on the high resistivity semiconductor layer 39a to form the terrace 15d. In the third region 13c, the high resistivity semiconductor layer 39a makes contact with the metal layer 17 at the strip-shaped opening of the passivation film 31. In the quantum cascade laser 11b, the high resistivity semiconductor layer 39a extends on the principal surfaces of the first, second and third regions 13a, 13b and 13c, without being disposed on the semiconductor mesa 25 in the fourth region 13d and making contact with the metal layer 17 at the strip-shaped opening 31a, and separates the metal reflective film 21 from the metal layer 17.

The first and second portions 15e and 15f of the high specific resistance region 15 have a first thickness D1 and a second thickness D2, respectively. The second thickness D2 is different from the first thickness D1, and in the present embodiment, is smaller than the first thickness D1. The first and second portions 15e and 15f may be adjoined to each other so as to form the difference in level 15d, which can be provided by the first portion 15e of the first thickness D1 and the second portion 15f of the second thickness D2. Furthermore, the third portion 15g has a third thickness D3, and in the present embodiment, the third thickness D3 has substantially the same thickness as the second thickness D2. The first, second and third portions 15e, 15f, and 15g extend in the direction of the second axis Ax2, and the arrangement of the first to third portions 15e to 15f forms a recess 15h, which extends in the direction of the second axis Ax2. The recess 15h can space the metal layer 17 apart from the metal reflective film 21.

An illustrative quantum cascade laser 11.
Laser structure 13 is made of semiconductor.
Length of the first region 13a (the length taken in the direction of the first axis Ax1): 5 to 100 micrometers.
Length of the second region 13b (the length taken in the direction of the first axis Ax1): 5 to 50 micrometers.
Depth of the difference in level 15d: 50 to 150 nanometers.
Thickness of the high specific resistance region 15 on the first region 13a: 200 to 400 nanometers.
Thickness of the high specific resistance region 15 on the second region 13b: 50 to 350 nanometers.
Dielectric film 19: alumina, aluminum nitride, having a thickness of 100 to 300 nanometers.
Metallic reflective film 21: gold, having a thickness of 50-300 nanometers.
In the present embodiment, the dielectric film 19 and the metal reflective film 21 form the end face reflection film 20. The reflection film 20 on the end face is, however, not limited to these two layers.
Core layer 25a: superlattice arranged to generate quantum cascade, e.g., AlInAs/GaInAs.
Upper semiconductor layer 25b: n-type InP (cladding layer 25e) and n-type InGaAs (diffraction grating layer 25f).
Lower semiconductor region 25c: n-type InP (cladding layer).
Contact layer 25d: n-type InGaAs.
Semiconductor substrate 23: n-type InP.
Embedding region 27: undoped and/or semi-insulating III-V compound semiconductor, e.g., Fe-doped InP.
Cavity length: 1 to 3 mm.
Metal layer 17: Ti/Pt/Au working as an ohmic electrode.
Back metal layer 37: AuGeNi/Ti/Pt/Au.
Passivation film 31: SiON, SiN, $SiO_2$.
Thick film electrode 35: plated Au.

Referring to FIGS. 1 and 2, a light emitting device 41 is drawn. The light emitting device 41 includes the quantum cascade laser 11, a support 43, and a solder material 45. The quantum cascade laser 11 is fixed to the electrode layer 43b on the insulating base 43a of the support 43 with the solder material 45. The solder material 45 forms a junction with the back metal layer 37 of the quantum cascade laser 11. In some cases, the solder material 45 may connect the metal reflective film 21 to the electrode layer 43b disposed on the insulating base 43a. The first and second regions 13a and 13b delimited by the difference in level 15d makes it possible to separate the fragment DPI on the high specific resistance region 15 on the first region 13a from the semiconductor of the second region 13b. In the present embodiment, the solder material 45 includes, for example, AuSn.

The light emitting device 41 provides the quantum cascade laser 11 with the dielectric film 19 and the metal reflective film 21 on the first end face E1F of the laser structure 13. The order of processes for forming the dielectric film 19 and the metal reflective film 21 allows the dielectric film 19 to underlie the metal reflective film 21. Inventor's findings reveal that flux of raw material for the dielectric film 19 not only forms deposited material on the first end face E1F of the laser structure 13 but also after flying along the upper and lower faces of the laser bar providing the laser structure 13, forms deposited material on the high specific resistance region for the high specific resistance region 15 on the first region 13a, and that similarly, raw material for the metal reflective film 21 not only forms deposited material on the end face of the laser structure and but also flies along the upper and lower faces of the laser bar before forming deposited material on the high specific resistance region 15. Inventor's Observations reveal also show that the deposited material for the dielectric film 19 on the high specific resistance region 15, however, has a thickness smaller than that of the dielectric film 19 on the end face of the laser bar (the first end face E1F of the laser structure 13). The high specific resistance region 15 on the laser structure 13 spaces the metal reflective film 21 on the dielectric film 19 from the semiconductor of the laser structure 13. The difference in level 15d of the high specific resistance region 15 makes it possible to separate the metal reflective film 21 on the high specific resistance region 15 from the metal layer 17.

With reference to FIGS. 3A, 3B and 3C, FIGS. 4A, 4B and 4C, FIGS. 5A and 5B, 6A, FIGS. 6B and 6C, FIGS. 7A, 7B and 7C, FIGS. 8A, 8B and 8C, FIGS. 9A, 9B and 9C, FIGS. 10A, 10B, 10C and 10D, and FIGS. 11A and 11B, a description will be given of major steps in a method for fabricating the semiconductor laser. In the following description, for facilitating understanding, reference numerals used in the forgoing description made with reference to FIGS. 1 and 2 are used, whenever possible.

Figure 3A:
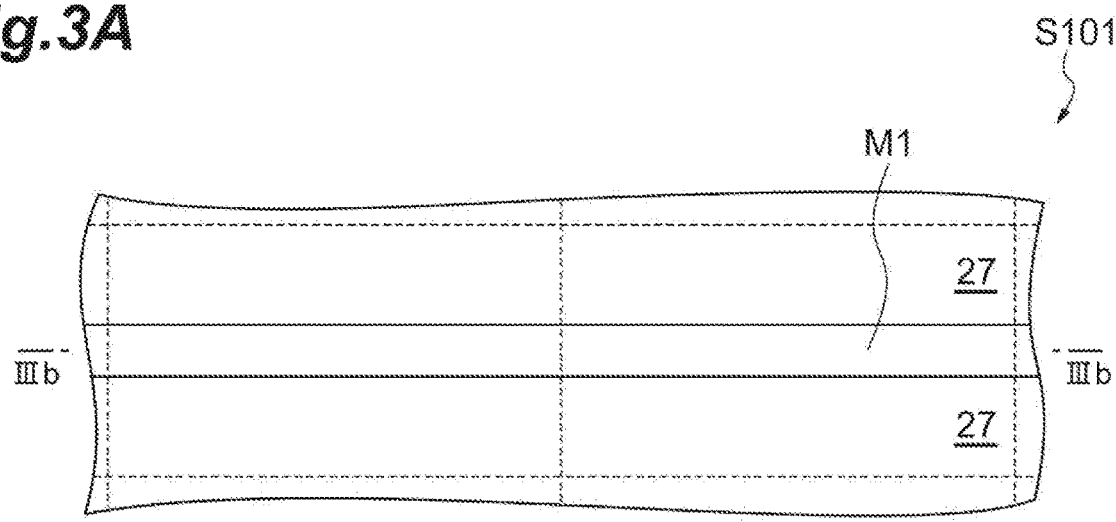
FIG. 3A is a schematic view illustrating a major step in methods of fabricating a semiconductor laser and a light emitting device according to the present embodiment.
Figure 3B:
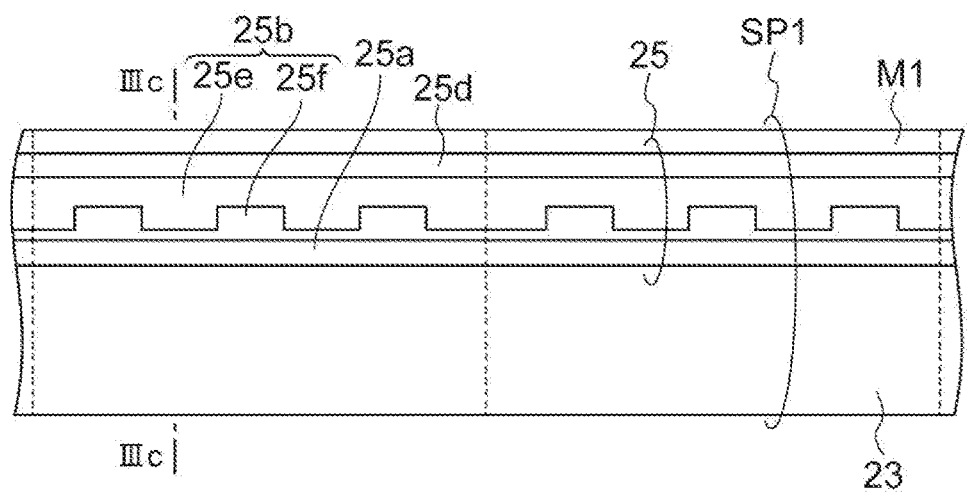
FIG. 3B is a schematic view illustrating a major step in the methods of according to the embodiment.
Figure 3C:
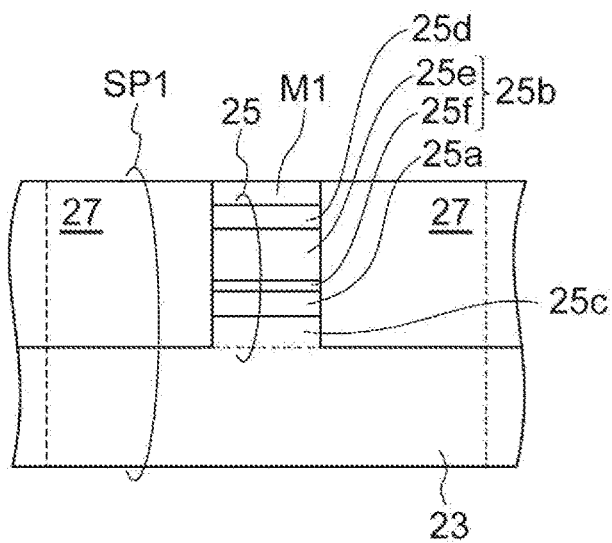
FIG. 3C is a schematic view illustrating a major step in the methods according to an embodiment.

Step S101 will be described with reference to FIGS. 3A to 3C. FIG. 3A is a plan view showing a major step in the method according to an embodiment. FIG. 3B is a cross sectional view taken along line IIIb-IIIb shown in FIG. 3A. FIG. 3C is a cross sectional view taken along line IIIc-IIIc shown in FIG. 3B. In step S101, a semiconductor product SP1 is prepared. The semiconductor product SP1 includes a semiconductor substrate 23, a semiconductor mesa 25 disposed on the semiconductor substrate 23, and an embedding region 27 embedding the semiconductor mesa 25. The semiconductor mesa 25 is formed as follows: growing an epitaxial substrate that includes semiconductor regions for the core layer 25*a*, the diffraction grating layer 25*f*, the cladding layer 25*e*, and the contact layer 25*d*, which are epitaxially grown; etching the epitaxial substrate with a first mask M1 to a part (25*c*) of the semiconductor substrate 23; and after forming the semiconductor mesa 25. A high resistance semiconductor is selectively grown with the first mask M1 to form the embedding region 27, and the selective growth is followed by the removal of the first mask M1.

Specifically, an n-type lower cladding layer (n-InP), a core layer (QCL active layer), and a diffraction grating layer (InGaAs) are epitaxially grown on an n-type InP substrate, and a diffraction grating structure is produced from the diffraction grating layer by photolithography and etching. On the diffraction grating structure, an n-type upper cladding layer (n-InP) and an n-type contact layer (n-InGaAs) are epitaxially grown. On the contact layer, a strip-shaped SiN mask is formed by CVD and photolithography. The SiN mask is used to perform a dry-etching process to the depth of the InP substrate, thereby forming a mesa. The mesa is embedded by a semiconductor embedding layer (Fe-doped InP) by epitaxially growing it on the InP substrate by using the SiN mask. The Fe-doped InP is grown and the Fe—InP thus grown has the same thickness as the height of the upper face of the SiN mask covering the mesa. The SiN mask is removed after this growth.

Figure 4A:
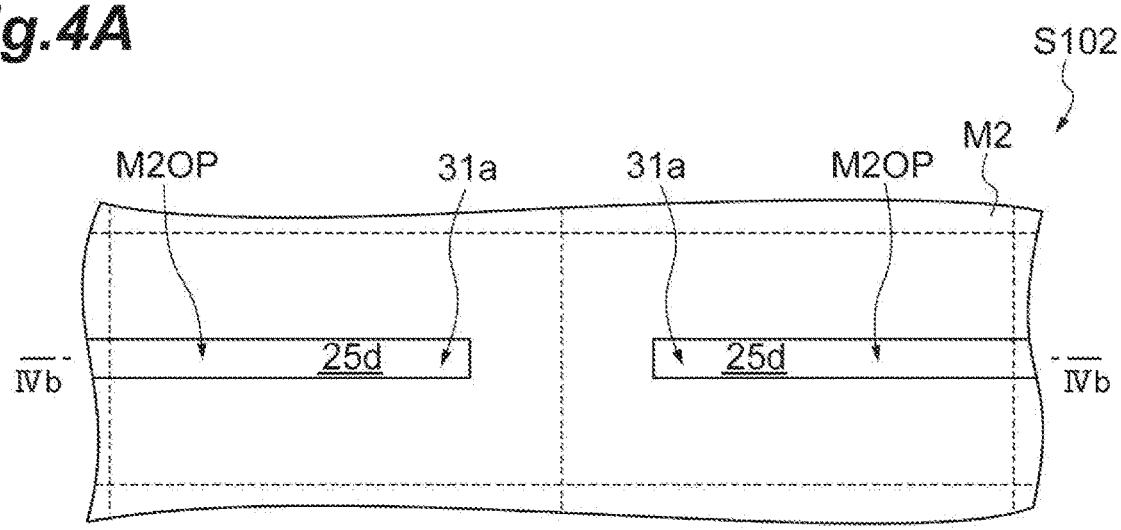
FIG. 4A is a schematic view showing a major step in the methods according to the embodiment.
Figure 4B:
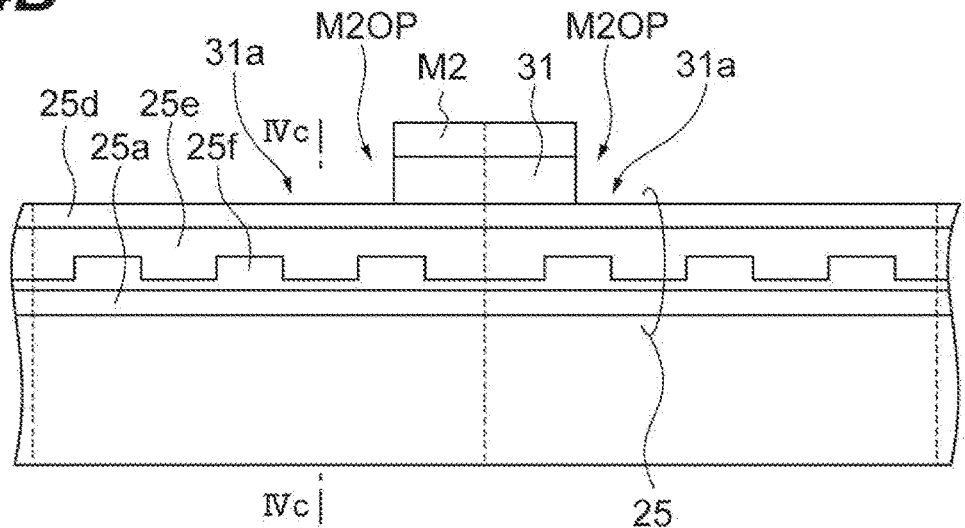
FIG. 4B is a schematic view showing a major step in the methods according to the embodiment.
Figure 4C:
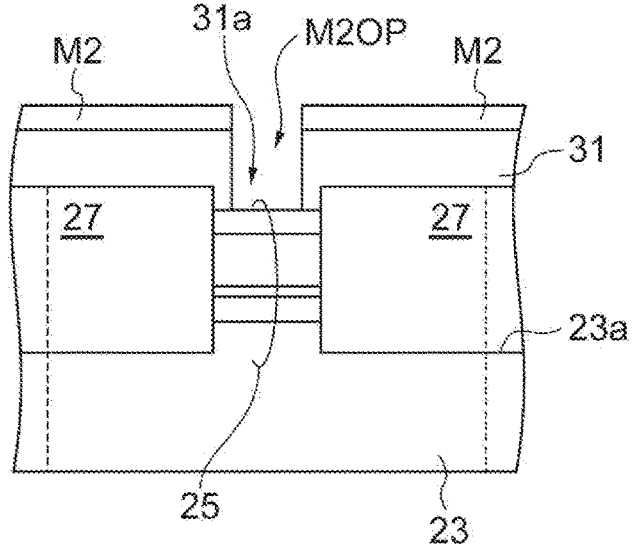
FIG. 4C is a schematic view showing a major step in the methods according to the embodiment.

Step S102 will be described with reference to FIGS. 4A, 4B and 4C. FIG. 4A is a plan view showing a major step in the method according to the present embodiment. FIG. 4B is a cross sectional view taken along line IVb-IVb shown in FIG. 4A. FIG. 4C is a cross sectional taken along line IVc-IVc shown in FIG. 4B. In step S102, a passivation film 31 is formed. In the present embodiment, an insulating film (having a thickness of 200 to 400 nm) is grown for the passivation film 31. A second mask M2 is formed thereon by photolithography and etching. The second mask M2 has a strip-shaped opening M2OP, which extends on the semiconductor mesa 25. Etching with the second mask M2 forms an opening in the insulating film, thereby producing the passivation film 31 from the insulating film. The passivation film 31 is provided with a strip-shaped opening 31*a* at which the upper surface (the contact layer 25*d*) of the semiconductor mesa 25 appears.

Specifically, after forming the embedding growth, a SiON film (having a thickness of 300 nm) is formed by CVD on the semiconductor mesa 25 and the embedding region 27. The SiON film is processed by photolithography and dry etching to form a strip-shaped opening. This opening exposes the upper face of the contact layer. The distance between the openings on the semiconductor mesas in adjoined device sections is about 200 micrometers, and the product that the subsequent processes will form is to be cleaved at approximately the center between the openings of the adjoined device sections to form a laser bar. This cleavage allows the laser bar thus formed to have an end face apart from the edge of the strip-shaped opening of the SiON film by about 100 micrometers.

Figure 5A:
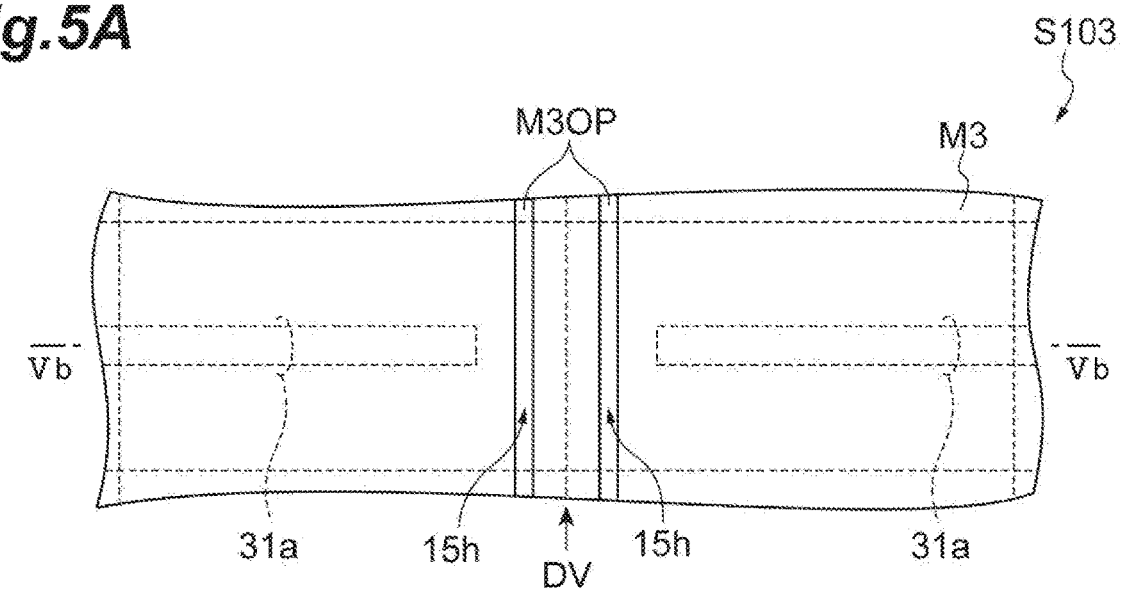
FIG. 5A is a schematic view showing a major step in the methods according to the embodiment.
Figure 5B:
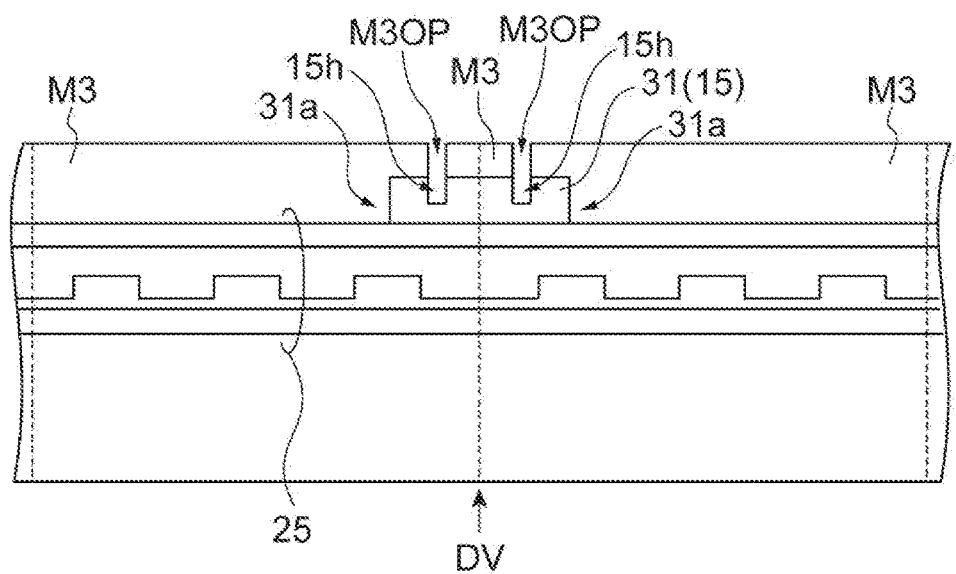
FIG. 5B is a schematic view showing a major step in the methods according to the embodiment.

Step S103 will be described with reference to FIGS. 5A and 5B. FIG. 5A is a plan view showing a major step in the method according to the present embodiment. FIG. 5B is a cross sectional taken along line Vb-Vb shown in FIG. 5A. The passivation film 31 is processed to have a structure for the high specific resistance region 15 therein. In the present embodiment, the insulating film for the passivation film 31 can be used to form the high specific resistance region 15. In step S103, the passivation film 31 is processed to have a groove. A third mask M3 defining the groove is formed on the passivation film 31. The third mask M3 has an opening M3OP on the semiconductor mesa 25, and the opening M3OP extends across the device sections in a direction intersecting the direction in which the semiconductor mesa 25 extends. The opening M3OP is disposed in the vicinity of a separation line DV where a product to be brought by the following fabricating process is to be separated. The third mask M3 includes, for example, resist. The passivation film 31 is etched with the third mask M3 to form a recess 15*h* (a groove in the present embodiment). The recess 15*h* has a bottom in the passivation film 31, which is separated from the second face 15*b* of the high specific resistance region 15. After the etching, the third mask M3 is removed.

Specifically, after forming the passivation SiON film, a resist mask is formed on the SiON film and the contact layer by photolithography. The resist mask has an opening, which extends across the device sections slightly away from a cleavage line where cleavage planes are to be formed, in the vicinity of the cleavage line. The SiON film is dry-etched with the resist mask to form a groove having a depth of 150 nm therein. After this etching, the resist mask is removed.

Figure 6A:
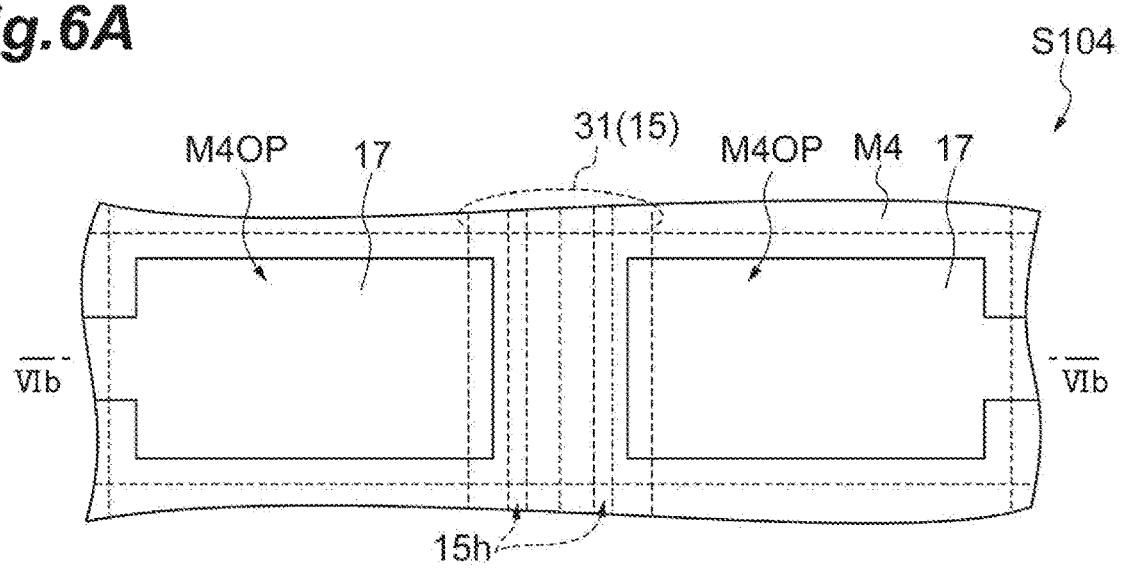
FIG. 6A is a schematic view showing a major step in the methods according to the embodiment.
Figure 6B:
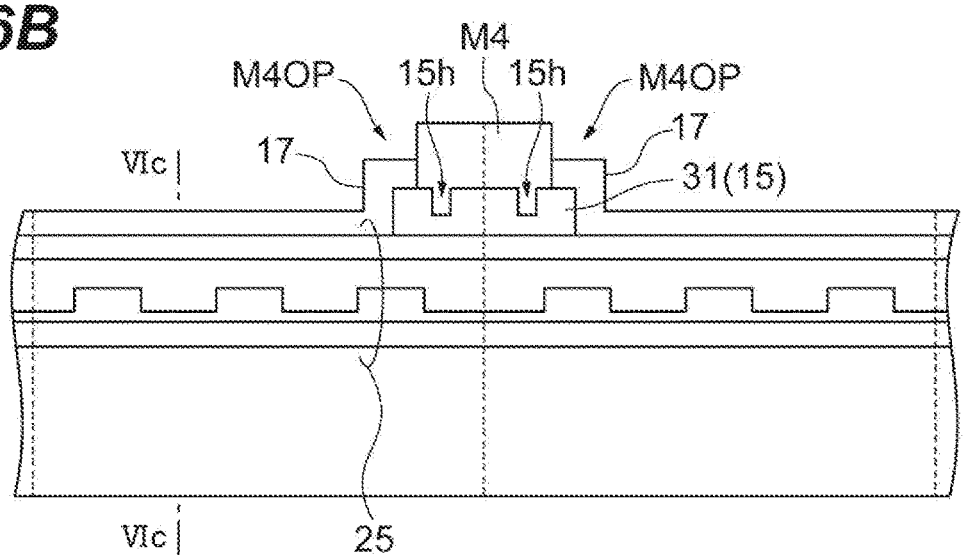
FIG. 6B is a schematic view showing a major step in the methods according to the embodiment.
Figure 6C:
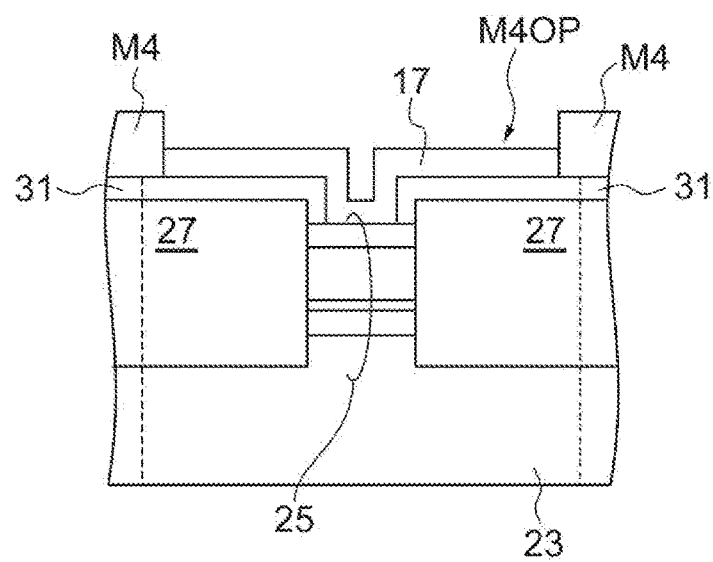
FIG. 6C is a schematic view showing a major step in the methods according to the embodiment.

Step S104 will be described with reference to FIGS. 6A to 6C. FIG. 6A is a plan view showing a main step in the method according to the present embodiment. FIG. 6B is a cross sectional view taken along line VIb-VIb shown in FIG. 6A. FIG. 6C is a cross sectional view taken along line VIc-VIc shown in FIG. 6B. In step S104, a metal layer 17 (an ohmic electrode) is formed. A fourth mask M4 for lift-off is formed on the passivation film 31. The fourth mask M4 has an opening M4OP on the semiconductor mesa 25. After forming the fourth mask M4, a metal film for the metal layer 17 is deposited. This deposition process forms deposited material for the metal film in the opening M4OP of the fourth mask M4 and on the fourth mask M4. After the deposition, the removal of the fourth mask M4 leaves the metal layer 17.

Specifically, a lift-off resist mask is formed on the wafer by photolithography. After forming the lift-off mask, a film of Ti/Pt/Au is formed by vapor deposition, and the lift-off mask and the deposited material on the lift-off mask are removed in the lift-off process to form an ohmic electrode. The ohmic electrode provides a base for a plated electrode which a subsequent process will form. The ohmic electrode of Ti/Pt/Au is in direct contact with the contact layer to enable electrical connection, and is in contact with the SiON film. If necessary, the lift-off mask may be provided with an additional pattern allowing the formation of a power supply metal for subsequent plating, and the metal layer thus formed with the mask includes both an ohmic electrode and a power supply line.

Figure 7A:
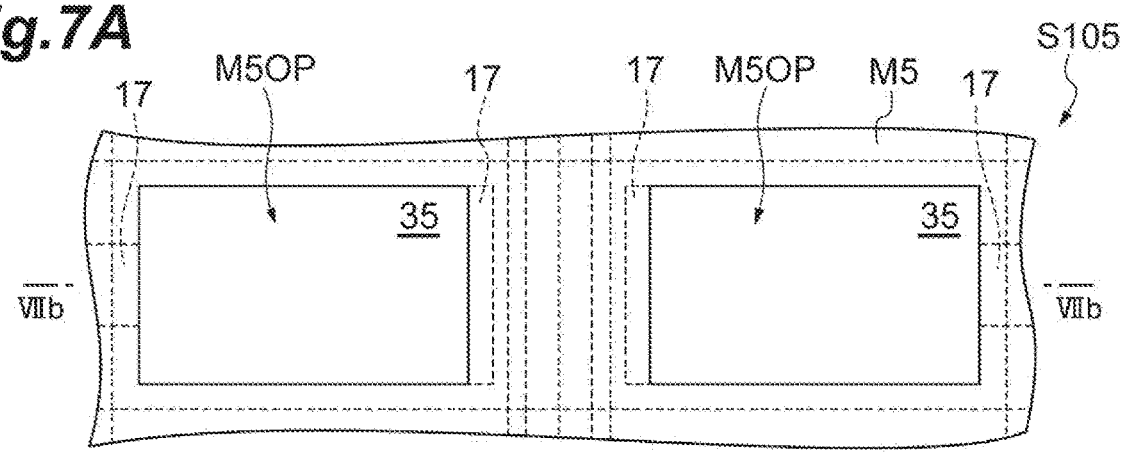
FIG. 7A is a schematic views each showing a major step in the methods according to the embodiment.
Figure 7B:
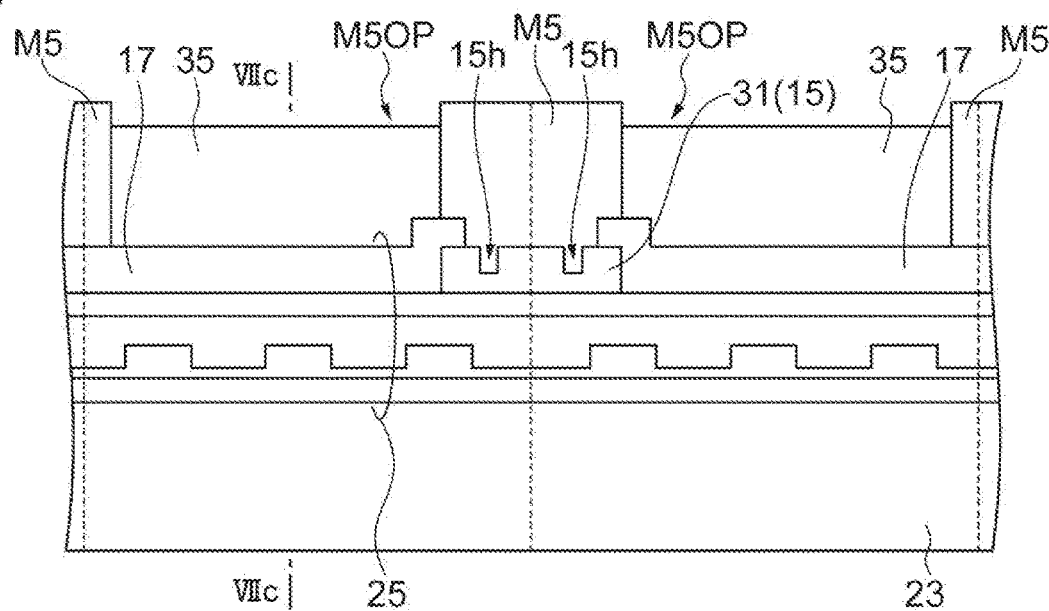
FIG. 7B is a schematic view showing a major step in the methods according to the embodiment.
Figure 7C:
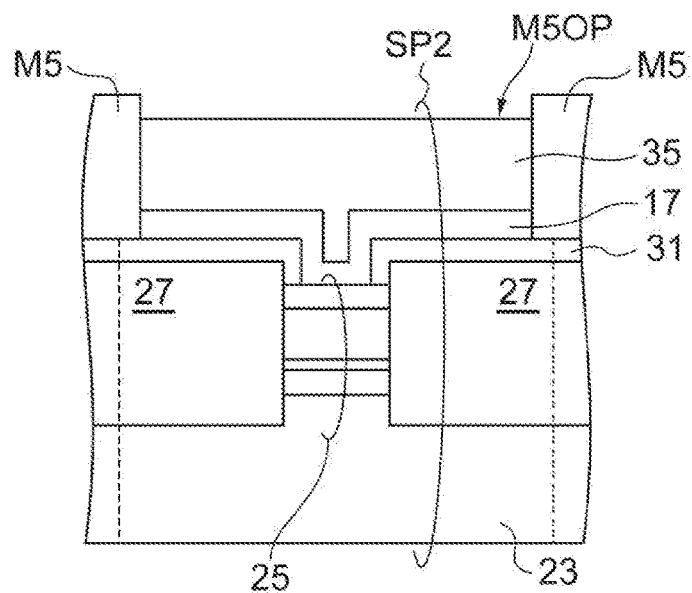
FIG. 7C is a schematic view showing a major step in the methods according to the embodiment.

Step S105 will be described with reference to FIGS. 7A to 7C. FIG. 7A is a plan view showing a major step in the method according to the present embodiment. FIG. 7B is a cross sectional view taken along line VIIb-VIIb shown in FIG. 7A. FIG. 7C is a cross sectional view taken along line VIIc-VIIc shown in FIG. 7B. In step S105, a thick film electrode 35 is formed by electroplating. A fifth mask M5 is formed on the passivation film 31 and the metal layer 17. The fifth mask M5 has an opening M5OP on the metal layer 17, and covers the recess 15*h* (in particular, the groove). The opening M5OP is disposed on the metal layer 17. Metal for the thick film electrode 35 is plated with the fifth mask M5 thus formed. In this plating process, plated material is formed on the metal layer 17 in the opening M5OP of the fifth mask M5. Energization for the plating process forms a thick metal film for the thick film electrode 35 and is followed by the removal of the fifth mask M5.

Specifically, a resist mask for plating is formed on the wafer by photolithography. The resist mask has an opening, for example, on the metal layer 17. Power is fed for plating gold (Au) with the resist mask. After the power feeding for plating, the plating mask is removed. Forming the plating electrode produces the substrate product SP2.

Figure 8A:
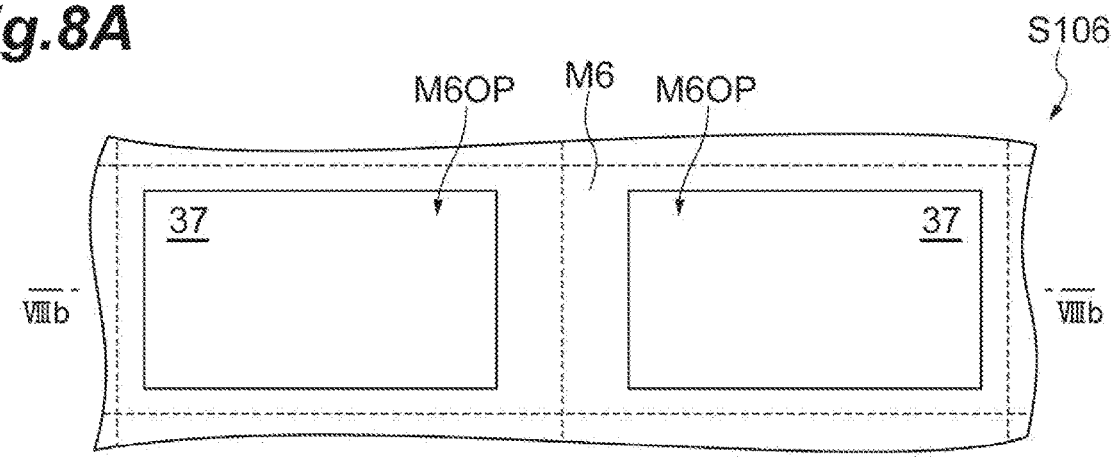
FIG. 8A is a schematic view showing a major step in the methods according to the embodiment.
Figure 8B:
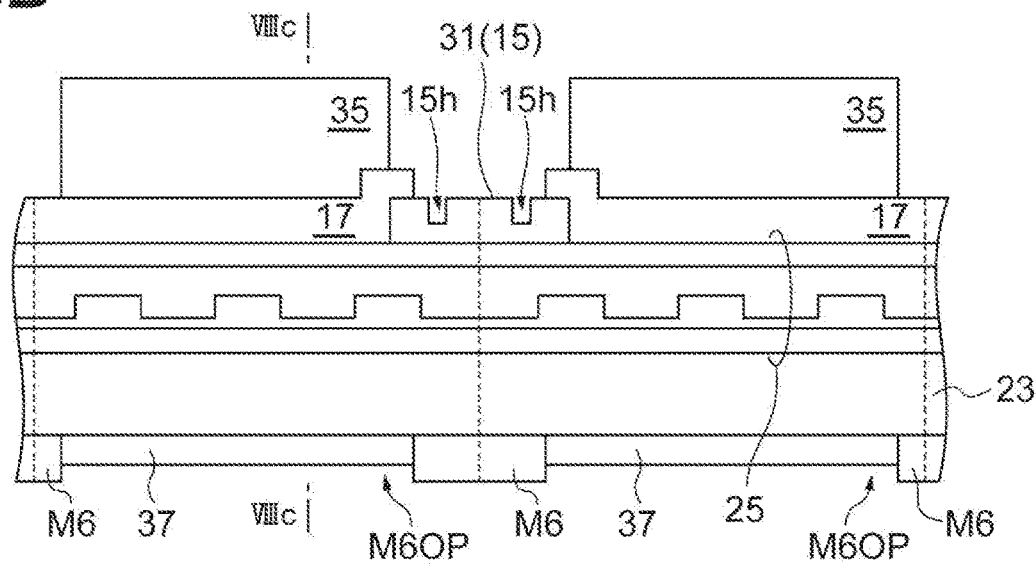
FIG. 8B is a schematic view showing a major step in the methods according to the embodiment.
Figure 8C:
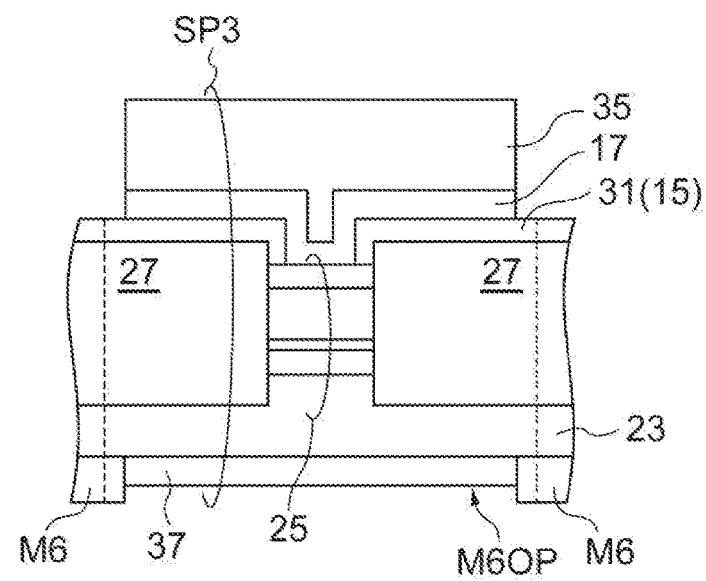
FIG. 8C is a schematic view showing a major step in the methods according to the embodiment.

Step S107 will be described with reference to FIGS. 8A to 8C. FIG. 8A is a plan view showing a major step in the method according to the present embodiment. FIG. 7B is a cross sectional view taken along line VIIIb-VIIIb shown in FIG. 8A. FIG. 8C is a cross sectional view taken along the line VIIIc-VIIIc shown in FIG. 8B. In step S106, a backside metal layer 37 is formed for the backside electrode. A sixth mask M6 for lift-off is formed on the backside of the semiconductor substrate 23. The sixth mask M6 has an opening M6OP on the backside metal layer 37. After forming the sixth mask M6, a film of AuGeNi/Ti/Pt/Au is formed by vapor deposition, and deposited material on the sixth mask M6 and the sixth mask M6 are removed in the lift-off process to form the backside metal layer 37. The backside metal layer 37 of AuGeNi/Ti/Pt/TiAu is in direct contact with the semiconductor substrate 23 to enable electrical connection. The formation of the backside metal brings the product SP3.

Specifically, a resist mask is formed on the backside of the wafer by photolithography. This backside mask has an opening, which is away from the boundary of the device sections, on the backside of the semiconductor substrate 23. The vapor deposition and the lift-off process with the backside mask produce the backside electrode from the AuGeNi/Au/TiAu film. Specifically, the backside mask has patterns, each of which extends along the boundary of the device sections and can have a strip-shape, on boundary areas of the backside, and the boundary of the device sections is in each of the boundary areas, so that the backside electrode is not formed on the boundary areas.

Figure 9A:
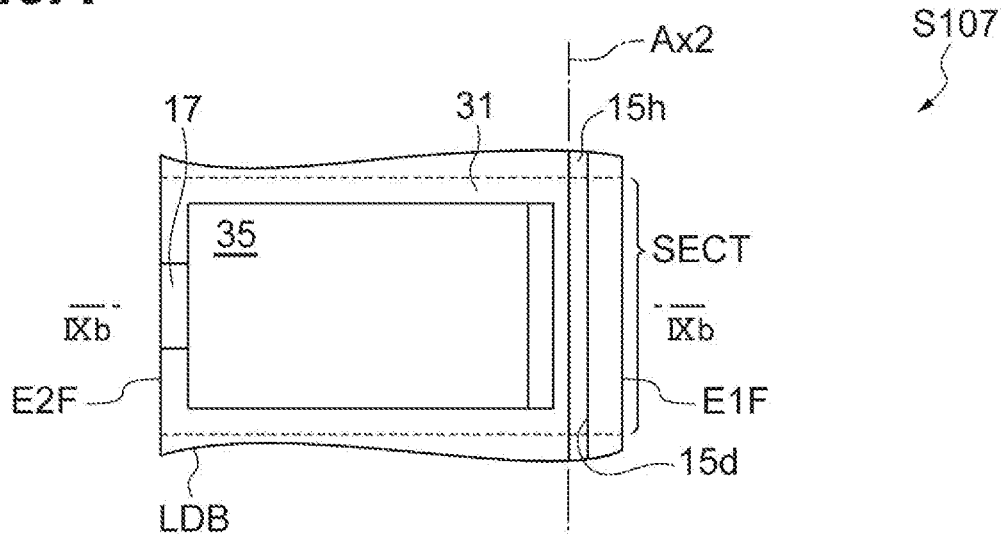
FIG. 9A is a schematic view showing a major step in the methods according to the embodiment.
Figure 9B:
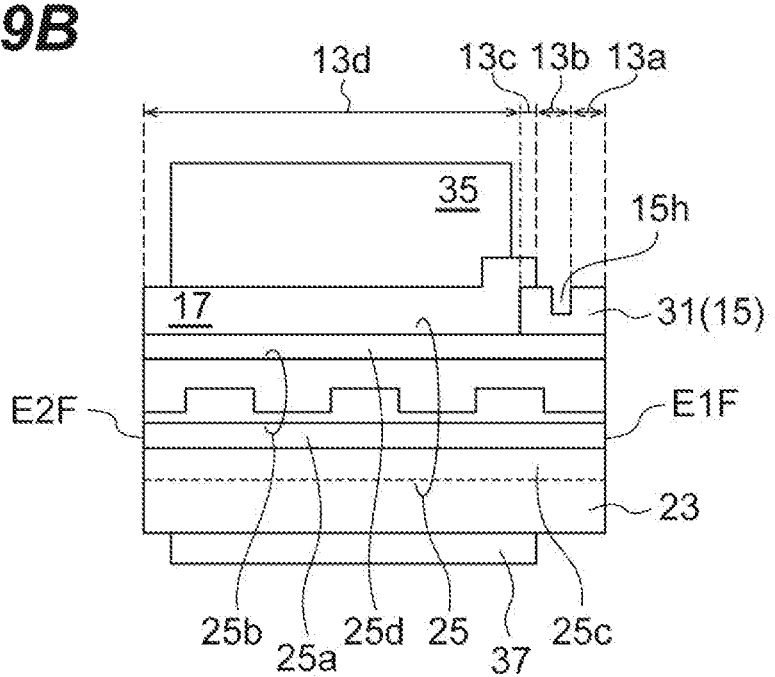
FIG. 9B is a schematic view showing a major step in the methods according to the embodiment.
Figure 9C:
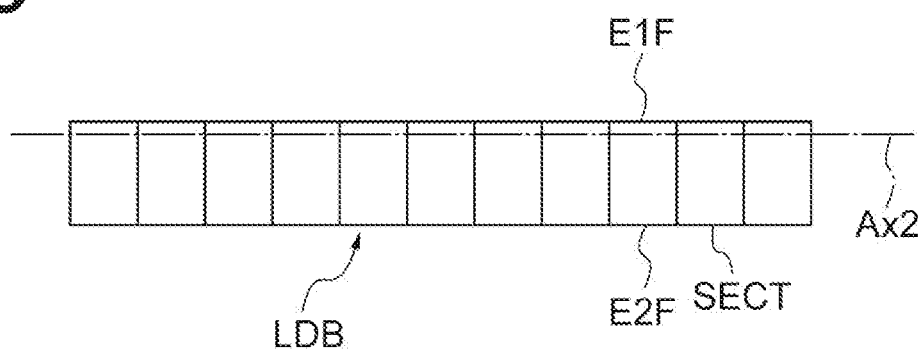
FIG. 9C is a schematic view showing a major step in the methods according to the embodiment.

Step S107 will be described with reference to FIGS. 9A to 9C. FIG. 9A is a plan view showing a major step in the method according to the present embodiment. FIG. 9B is a cross sectional view taken along line IXb-IXb shown in FIG. 9A. FIG. 9C is a plan view showing the laser bar. Step S107 prepares laser bars LDB. The laser bars LDB are produced from the product SP3, which is separated along cleavage lines in the boundary areas. This separation forms each laser bar LDB that is provided with the first and second end faces E1F and E2F for the quantum cascade laser 11. Cleaving the product SP3 at the cleavage line, which is apart from the backside electrode, makes the first and second end faces E1F and E2F excellent. In the present embodiment, each of the first and second end faces E1F and E2F has a cleavage plane. The laser bar LDB includes an array of device sections SECT for the quantum cascade lasers 11a, and the device sections SECT are arranged in the direction of the second axis Ax2. As seen from FIG. 1, each device section SECT includes the laser structure 13, the passivation film 31 (the high specific resistance region 15), and the metal layer 17, and further includes the thick film electrode 35 and the backside metal layer 37. The laser structure 13 and the passivation film 31 extend continuously over the device sections SECT. The laser structure 13 has a first region 13a, a second region 13b, a third region 13c, and a fourth region 13d, which are sequentially arranged in the direction of the first axis Ax1. The first region 13a includes the first end face E1F, and the fourth region 13d includes the second end face E2F. The high specific resistance region 15 has the terrace wall 15d located at the boundary between the first and second regions 13a and 13b. The terrace wall 15d extends continuously over the device sections SECT in the direction of the second axis Ax2. The high specific resistance region 15 is disposed on the first, second, and third regions 13a, 13b and 13c. The metal layer 17 is disposed on the third and fourth regions 13c and 13d, and makes contact with the epi-surface of the fourth region 13d. The laser structure 13 includes a semiconductor substrate 23 and a semiconductor mesa 25, which is mounted on the principal surface 23a of the semiconductor substrate 23. The semiconductor mesa 25 includes a core layer 25a, and specifically, further includes an upper semiconductor layer 25b, a lower semiconductor region 25c, and a contact layer 25d. The semiconductor mesa 25 extends in the direction of the first axis Ax1. In the present embodiment, the laser structure 13 further includes an embedding region 27 embedding the semiconductor mesa 25.

Step S109 will be described with reference to FIGS. 10A to 10D. FIGS. 10A and 10B are schematic views each showing a major step in the method according to the embodiment. FIGS. 10C and 10D are schematic views each showing a major step in the method according to the embodiment. In step S109, the dielectric film 19 and the metal reflective film 21 are formed in order on the first end face E1F of the laser bar LDB thus prepared. As shown in FIGS. 10A and 10B, the dielectric film 19 is formed on the first end face E1F. In the present embodiment, the dielectric film 19 is deposited using the deposition apparatus D1EP. The deposition apparatus D1EP supplies flux F1 of raw material for the dielectric film 19 to the first end face E1F. The flux F1 that misses the first end face E1F flies along the upper and lower faces of the laser bar LDB to accumulate both on the passivation film 31 and the metal layer 17 on the upper face and on the backside metal layer 37 on the lower face. The deposited material, which connects with the dielectric film 19 on the first end face E1F, terminates at the difference in level 15d of the high resistance region 15, specifically the edge of the recess 15h (groove). Thereafter, as shown in FIGS. 10C and 10D, the metal reflective film 21 is formed on the dielectric film 19 on the first end face E1F of the laser bar LDB. In the present embodiment, the metal reflective film 21 is formed with the deposition apparatus D2EP. The deposition apparatus D2EP supplies flux F2 of raw material for the metal reflective film 21 to the first end face E1F. The flux F2 that misses the first end face E1F flies along the upper and lower faces of the laser bar LDB, so that deposited material for the metal reflective film 21 accumulates both on the passivation film 31 and the metal layer 17, which are located on the epi-surface, and on the backside metal layer 37 on the lower face. The deposited material, which connects with the metal reflective film 21 on the first end face E1F, terminates at the difference in level 15d of the high resistance region 15, specifically the edge of the recess 15h.

After forming the dielectric film 19 and the metal reflective film 21 in order on the first end face E1F of the laser bar LDB, the laser bar LDB is separated into chips for the quantum cascade laser 11. These steps bring the quantum cascade laser 11 to completion.

Figure 11A:
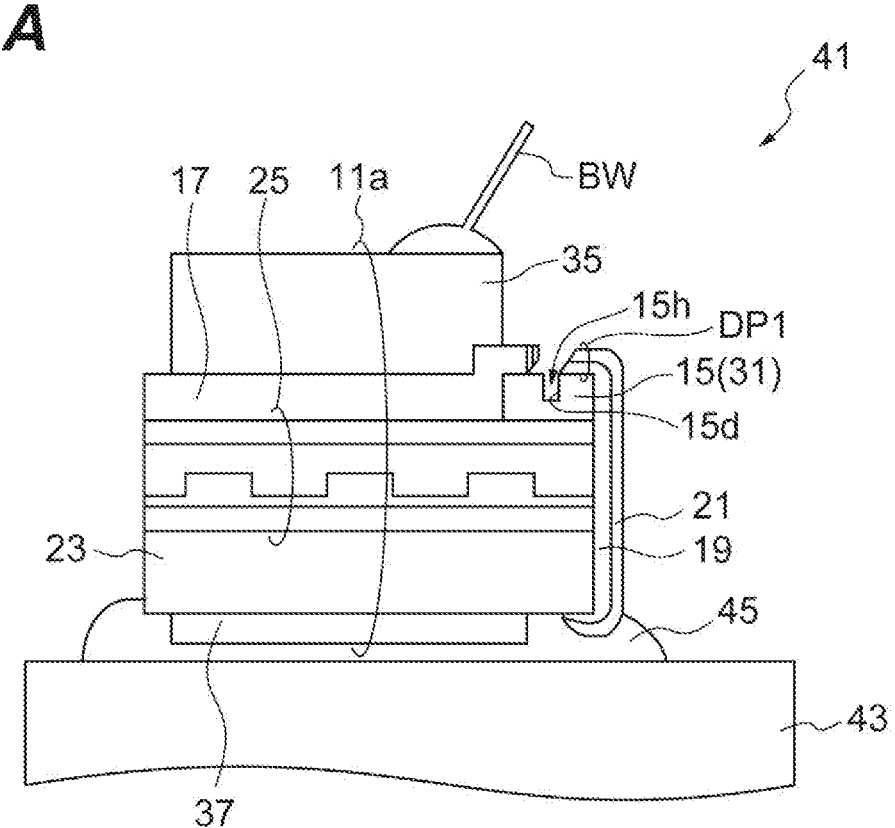
FIG. 11A is a schematic view showing a major step in the methods according to the embodiment.

A die bonding process will be described with reference to FIGS. 11A and 11B. FIG. 11A is a schematic view showing a die bonding step in the method according to the present embodiment. As seen from the description with reference to FIG. 1, in the quantum cascade laser 11a according to the present embodiment, the dielectric film 19 and the metal reflective film 21 on the first end face E1F makes contact with solder material 45, and do not make contact with the conductive semiconductor for the semiconductor mesa 25, the metal layer 17, and the thick film electrode 35. The thick film electrode 35 is connected to a wiring conductor BW.

Figure 11B:
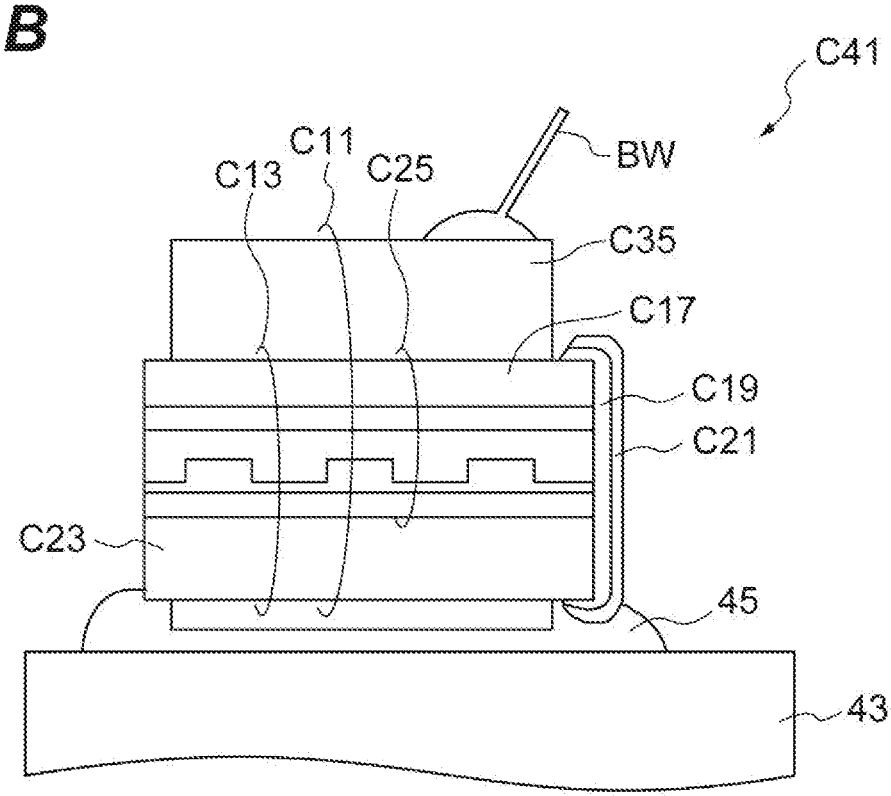
FIG. 11B is a schematic view showing a major step in the methods according to the embodiment.

FIG. 11B is a schematic view showing a step for die-bonding a quantum cascade laser having a structure of a reflection film different from the quantum cascade laser according to the embodiment. FIG. 11B shows the quantum cascade laser C11 having a dielectric film C19 and a metal reflective film C21 on the end face of the laser structure C13. The dielectric film C19 and the metal reflective film C21 extend onto the front faces of the laser structure C13 with the semiconductor substrate C23 to form top and back extensions thereon, and the top and back extensions reach the vicinity of the metal layer C17 on the front face and the back metal layer 37 on the back face, respectively. The die-bonding of the quantum cascade laser C11 by soldering causes the extension of the dielectric film C19 and the metallic reflective film C21, which are on the back face of the semiconductor substrate C23, to make contact with the solder material. The dielectric film C19 and the metal reflective film C21 extend onto the upper face of the laser structure C13 to form thin deposited materials, which are deposited on the ohmic electrode C33. These thin deposited materials for the dielectric film C19 and the metal reflective film C21 on the upper and lower faces of the laser structure C13 cause a short circuit.

The method of fabricating the quantum cascade laser 11a forms the dielectric film 19 and the metal reflective film 21 on the first end face E1F of the laser bar LDB. The dielectric film 19 is formed on the first end face E1F during the film formation, and in addition, deposited material for the dielectric film 19 extends onto the upper and lower faces of the laser bar LDB to accumulate, for example, on the high resistance region 15 (the passivation film 31) on the first region 13a. Similarly, deposited material for the metal reflective film 21 not only is formed on the first end face E1F but also extends onto the high specific resistance region 15 (the passivation film 31) in the first region 13a to accumulate on the first region 13a. The order of processes for forming the dielectric film 19 and the metal reflective film 21 provides the metal reflective film 21 with the ground made of the dielectric film 19. Inventor's observations show that deposited materials for the dielectric film 19 and the metal reflective film 21 have respective thicknesses smaller on the upper and lower faces of the laser bar LDB than on the first end face E1F and that the high specific resistance region 15 on the laser bar LDB separates the deposited material for the metal reflective film 21, which is formed on the deposited material for the dielectric film 19, from the semiconductor of the laser bar LDB. The difference in level 15d of the laser bar LDB makes it possible to separate the metal layer 17 from the deposited material for the metal reflective film 21 on the high specific resistance region 15.

A description will be given of major steps in the method for fabricating a semiconductor laser with reference to FIGS. 12A, 12B, and 12C, FIGS. 13A, 13B and 13C, FIGS. 14A, 14B, 14C and 14D, FIGS. 15A, 15B and 15C, FIGS. 16A, 16B and 16C, and FIGS. 17A, 17B, 17C, and 17D. In the following description, for easy understanding, reference numerals used in the description made with reference to FIGS. 1 and 2 are used, whenever possible.

Figure 12A:
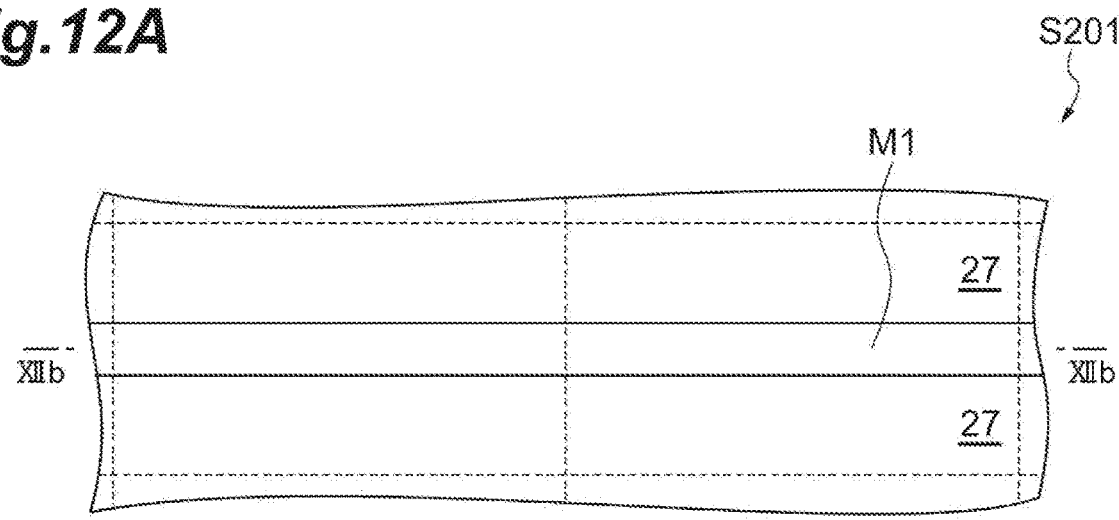
FIG. 12A is a schematic view showing a major step in the methods according to the other embodiment.
Figure 12B:
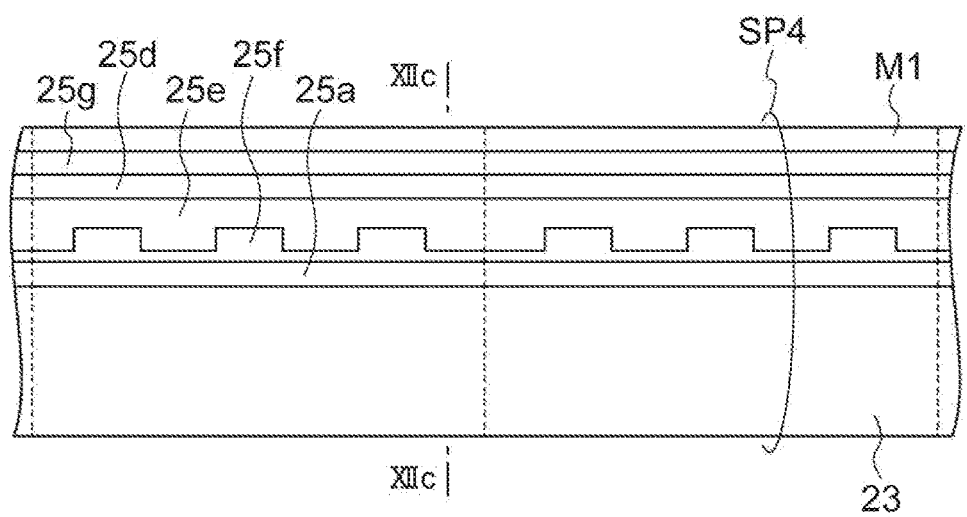
FIG. 12B is a schematic view showing a major step in the methods according to the other embodiment.
Figure 12C:
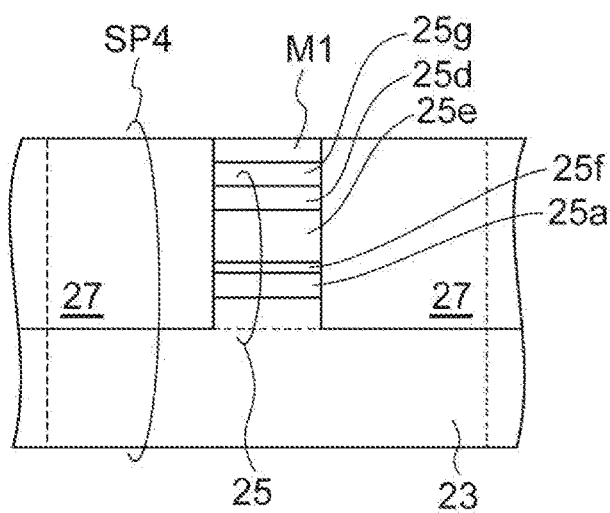
FIG. 12C is a schematic view showing a major step in the methods according to the other embodiment.

Step S201 will be described with reference to FIGS. 12A to 12C. FIG. 12A is a plan view showing a major step in the method according to the embodiment. FIG. 12B is a cross sectional view taken along line XIIb-XIIb shown in FIG. 12A. FIG. 12C is a cross sectional view taken along line XIIc-XIIc shown in FIG. 12B. Step S201 prepares a semiconductor product SP4. The semiconductor product SP4 has a semiconductor substrate 23, a semiconductor mesa 25 on the semiconductor substrate 23, and an embedding region 27 embedding the semiconductor mesa 25 and the cap layer 25g. The semiconductor mesa 25 is formed as follows: epitaxially growing an epitaxial substrate with the semiconductor substrate 23 and semiconductor regions for the core layer 25a, the diffraction grating layer 25f, the cladding layer 25e, the contact layer 25d, and the cap layer 25g; etching the epitaxial substrate with a mask M1 of a first inorganic insulating film (for example, SiN) to form the semiconductor mesa 25; selectively growing a high resistance semiconductor with the first mask M1 to form the embedding region 27; and removing the first mask M1 after the selective growth.

Specifically, semiconductor films for an n-type lower cladding layer (n-InP), a core layer (QCL active layer) and a diffraction grating layer (InGaAs) are epitaxially grown on an n-type InP substrate. The application of photolithography and etching to the semiconductor film for the diffraction grating layer (InGaAs) forms a diffraction grating structure having a diffraction grating, and on diffraction grating structure, conductive semiconductor films for an n-type upper cladding layer (n-InP) and a layer (n-InGaAs), and a semi-insulating semiconductor film for a cap layer (i-InP or Fe-doped InP) are epitaxially grown. A strip-shaped SiN mask is formed on the cap layer by CVD and photolithography. These semiconductor films and the InP substrate are dry-etched with the SiN mask to form a semiconductor mesa. After the dry etching, a semiconductor embedding layer (Fe-doped InP) is epitaxially grown on the InP substrate with the SiN mask to embed the mesa. The embedding Fe-doped InP thus growth has a thickness almost equal to the upper face of the SiN mask on the mesa. After this growth, the SiN mask is removed.

Figure 13A:
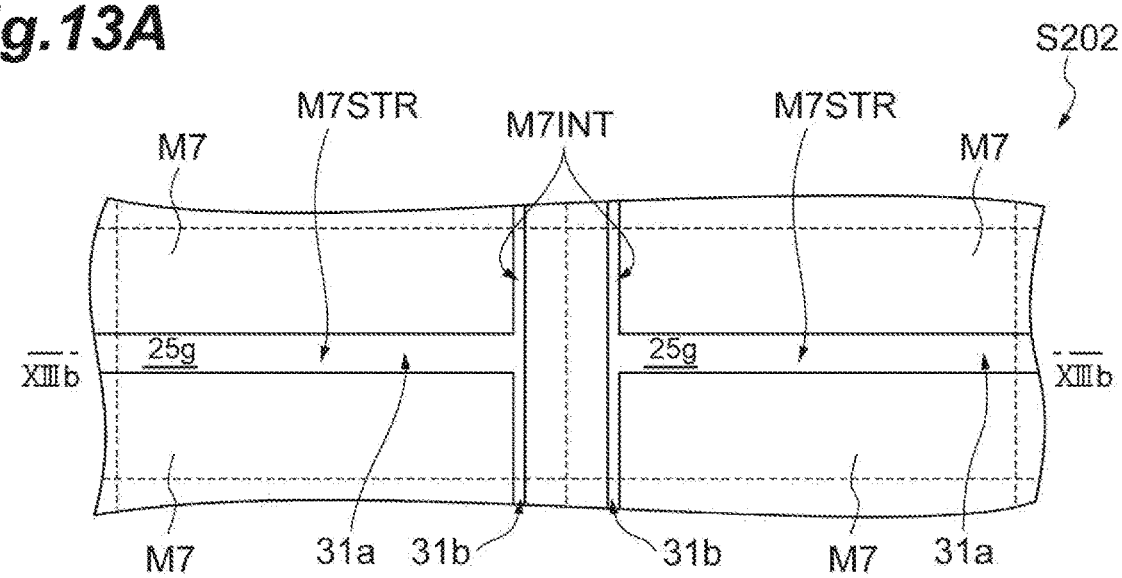
FIG. 13A is a schematic view showing a major step in the methods according to the other embodiment.
Figure 13B:
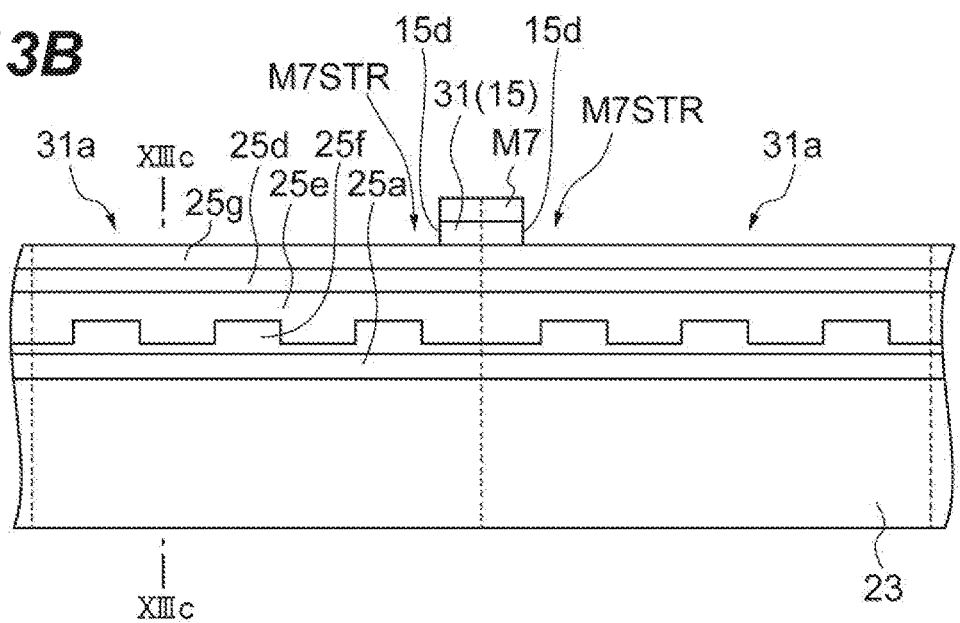
FIG. 13B is a schematic view showing a major step in the methods according to the other embodiment.
Figure 13C:
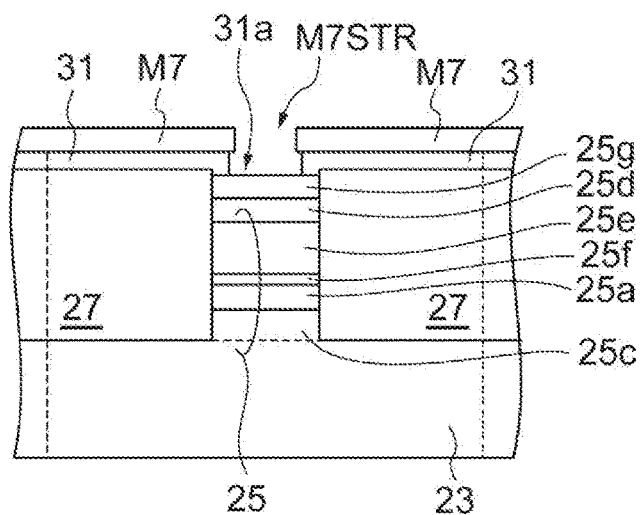
FIG. 13C is a schematic view showing a major step in the methods according to the other embodiment.

Step S202 will be described with reference to FIGS. 13A to 13C. FIG. 13A is a plan view showing a major step in the method according to the embodiment. FIG. 13B is a cross sectional view taken along line XIIIb-XIIIb shown in FIG. 13A. FIG. 13C is a cross sectional view taken along line XIIIc-XIIIc shown in FIG. 13B. Step S202 forms a passivation film 31. In the embodiment, an insulating film is grown for the passivation film 31. This insulating film is further processed by photolithography and etching to form a seventh mask M7. The seventh mask M7 can include, for example, a resist. The seventh mask M7 has a pattern having a first strip-shaped opening M7STR to extend on the semiconductor mesa 25 and the cap layer 25g and a second opening M7INT abutting the first opening M7STR. The insulating film is etched with the seventh mask M7 to form the passivation film 31. The passivation film 31 has a strip-shaped opening 31a extending on the semiconductor mesa 25 along the semiconductor mesa 25 and the cap layer 25g, and a strip-shaped opening 31b intersecting the semiconductor mesa 25. The strip-shaped opening 31a and the intersecting strip-shaped opening 31b exposes a semi-insulating semiconductor film for the cap layer 25g. The strip-shaped opening 31a reaches the intersecting strip-shaped opening 31b and terminates thereat. The intersecting strip-shaped opening 31b provides the terrace 15d of the high specific resistance region 15, and has a shape of a groove patterned in the passivation film 31. This groove has a bottom made of the cap layer 25g. After etching the insulating film, the seventh mask M7 is removed.

Specifically, after the embedding growth, a SiON film (having a thickness of 300 nm) is formed on the semiconductor mesa 25, the cap layer 25g, and the embedding region 27 by a chemical vapor deposition method. A resist mask is formed on the SiON film by photolithography, and has a pattern for the stripe opening 31a and the intersecting strip-shaped opening 31b. The SiON film is processed by etching with the resist mask. The strip-shaped opening 31a exposes the top of the semi-insulating semiconductor film for the cap layer. The spacing between the intersecting strip-shaped openings 31b in adjoining device sections is about 100 micrometers. The intersecting strip-shaped openings 31b can extend across the device sections. Further, the strip-shaped openings 31a extend from one of the intersecting strip-shaped openings 31b in the adjoining device sections to the other. The product subjected to the subsequent processes is cleaved at the boundary between the adjoining device sections. This cleavage forms laser bars each with the strip-shaped opening of the SiON film having an edge apart from the end face of the laser bar by about 50 micrometers.

Figure 14A:
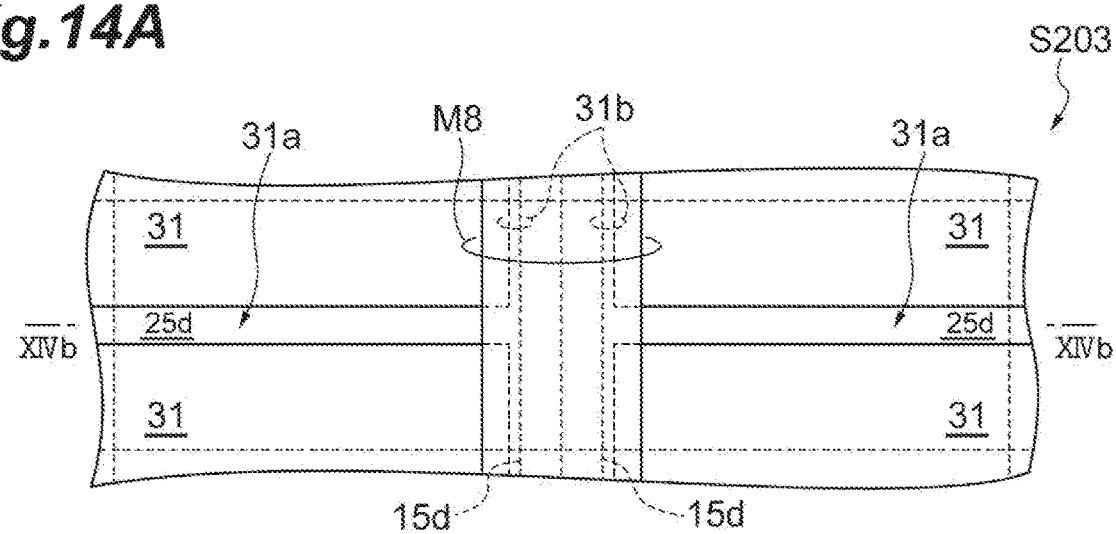
FIG. 14A is a schematic view showing a major step in the methods according to the other embodiment.
Figure 14B:
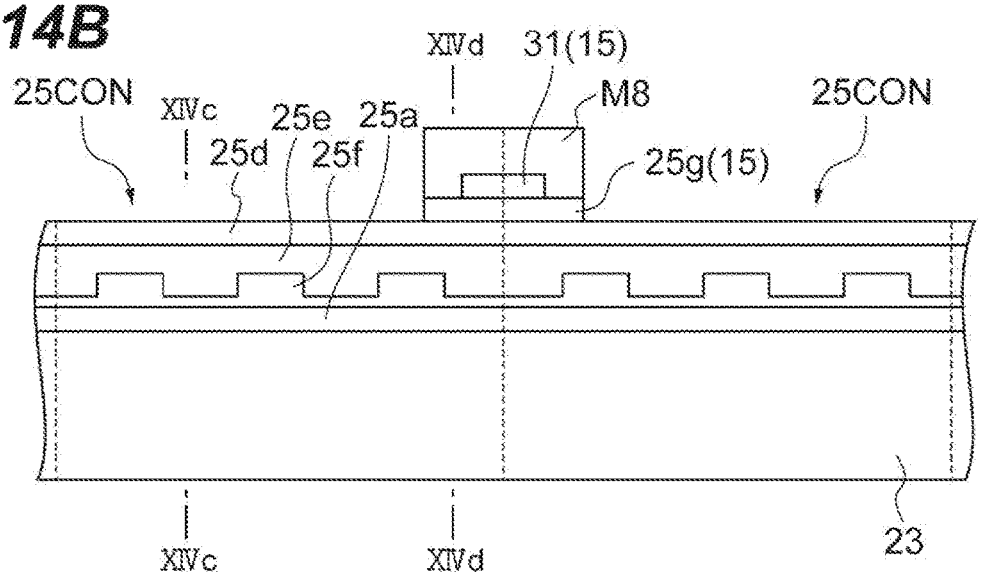
FIG. 14B is a schematic view showing a major step in the methods according to the other embodiment.
Figure 14C:
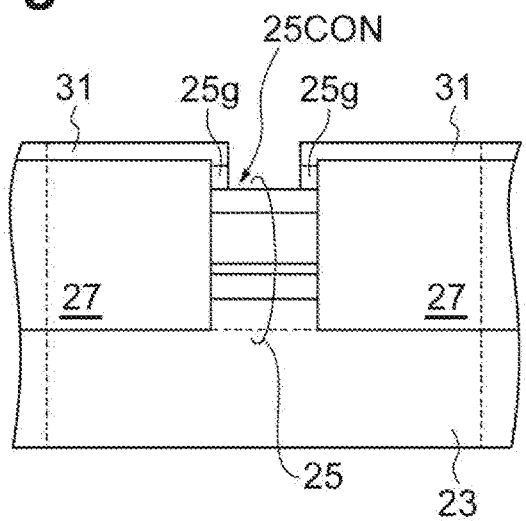
FIG. 14C is a schematic view showing a major step in the methods according to the other embodiment.
Figure 14D:
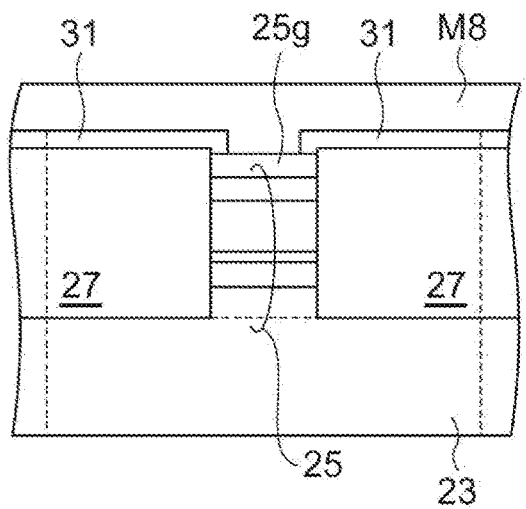
FIG. 14D is a schematic view showing a major step in the methods according to the other embodiment.

Step S203 will be described with reference to FIGS. 14A to 14D. FIG. 14A is a plan view showing a main step in the method according to the example. FIG. 14B is a cross sectional view taken along line XIVb-XIVb shown in FIG. 14A. FIG. 14C is a cross sectional view taken along line XIVc-XIVc shown in FIG. 14B. FIG. 14D is a cross sectional view taken along line XIVd-XIVd shown in FIG. 14B. The semi-insulating semiconductor film for the cap layer 25g, which appears at the strip-shaped opening 31a of the passivation film 31, is removed to form a contact opening 25CON to the contact layer 25d. The processing of the semi-insulating semiconductor film forms the cap layer 25g. In the present embodiment, an eighth mask M8 defining a contact opening is formed on the passivation film 31 and the semi-insulating semiconductor film. The eighth mask M8 covers the intersecting strip-shaped opening 31b, and has an opening on the contact layer 25d in the fourth region of the semiconductor device. This opening has a terminal end apart from the intersecting strip-shaped opening 31b. The combined pattern of the passivation film 31 and the eighth mask M8 allows the removal of the semi-insulating semiconductor film (for example, InP).

Specifically, after forming the SiON passivation film, a resist mask is formed on the SiON film and the contact layer by photolithography. The resist mask has an opening on an area which is to be a fourth region of the semiconductor device, and covers a device area which is to be the first to third regions of the semiconductor device. The semi-insulating semiconductor film is etched with the resist mask to form a cap layer 25g having a contact opening 25CON. After the etching, the resist mask is removed.

Figure 15A:
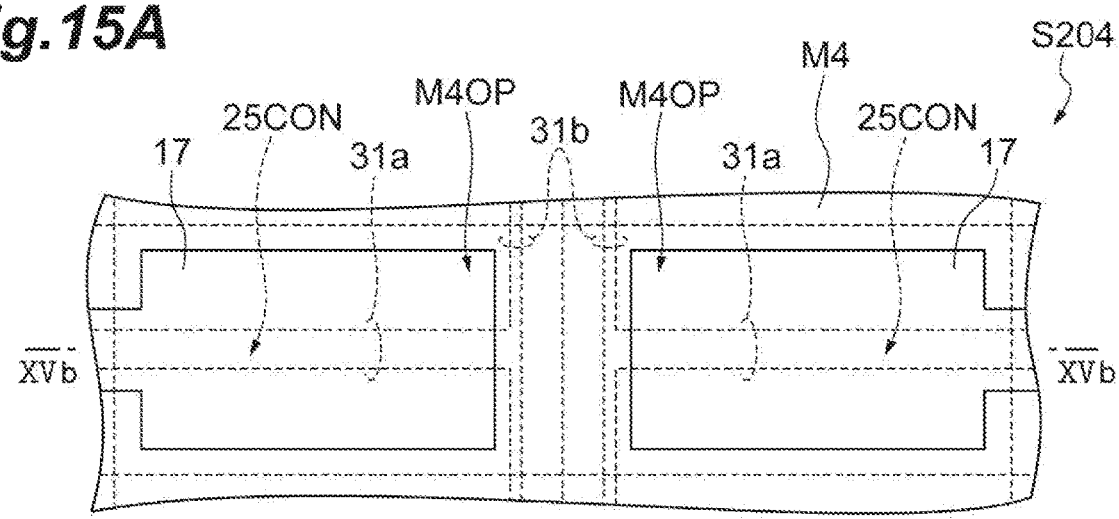
FIG. 15A is a view showing a major step in the methods according to the other embodiment.
Figure 15B:
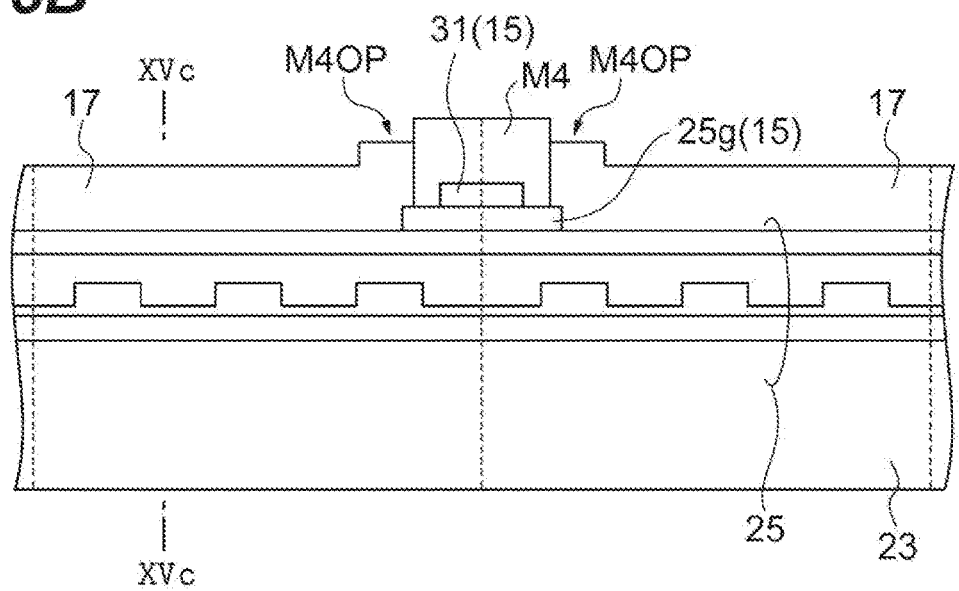
FIG. 15B is a schematic view showing a major step in the methods according to the other embodiment.
Figure 15C:
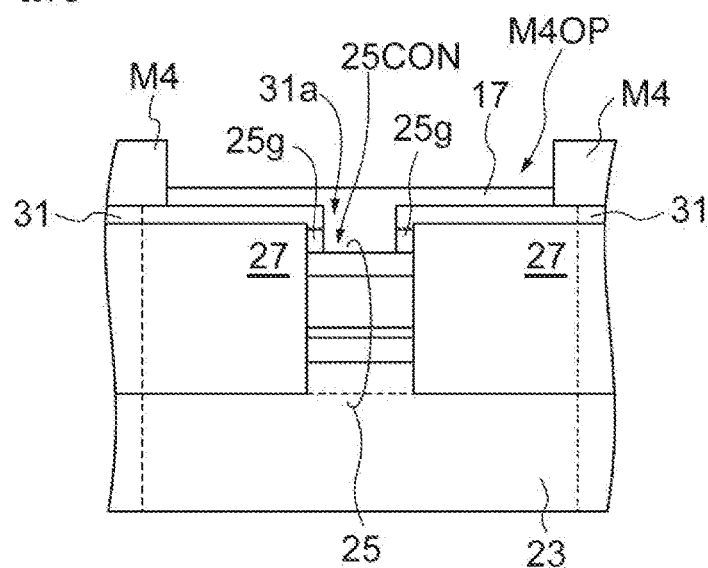
FIG. 15C is a schematic view showing a major step in the methods according to the other embodiment.

Step S204 will be described with reference to FIGS. 15A to 15C. FIG. 15A is a plan view showing a major step in the method according to the present embodiment. FIG. 15B is a cross sectional view taken along line XVb-XVb shown in FIG. 15A. FIG. 15C is a cross sectional view taken along line XVc-XVc shown in FIG. 15A. Step S204 forms a metal layer 17 (the ohmic electrode). As shown in FIGS. 6A to 6C, a fourth mask M4 for lift-off is formed on the passivation film 31. The fourth mask M4 has an opening M4OP on the semiconductor mesa 25. In the present embodiment, the opening M4OP is located on an area which is to be the third and fourth regions of the semiconductor device. After the fourth mask M4 is formed, a metal film is deposited for the metal layer 17. In the present deposition, deposited material for the metal film accumulates in the opening M4OP of the fourth mask M4 and on the fourth mask M4. After the deposition process, the removal of the fourth mask M4 leaves a metal layer for the metal layer 17, which extends through the arrangement of the device sections.

Specifically, a lift-off mask of resist is formed on the wafer by photolithography. On the lift-off mask thus formed, a Ti/Pt/Au film is formed by vapor deposition, and the lift-off mask and the deposited material thereon are removed by lift-off to form an ohmic electrode. The ohmic electrode of Ti/Pt/Au is electrically connected to the contact layer. Specifically, the ohmic electrode of Ti/Pt/Au is in direct contact with the SiON film. If necessary, the lift-off mask may have an additional pattern defining power supply lines allowing subsequent plating for forming a metal electrode, and the metal electrode includes an ohmic electrode and a power supply line.

In step S205, a thick film electrode 35 is formed by plating as in the process in step S105 described with reference to FIGS. 7A to 7C. In step S206, a backside metal layer 37 for the backside electrode is formed on the backside of the semiconductor substrate 23 similarly to the process the step S106 described with reference to FIGS. 8A to 8C. These steps can bring a substrate product.

Figure 16A:
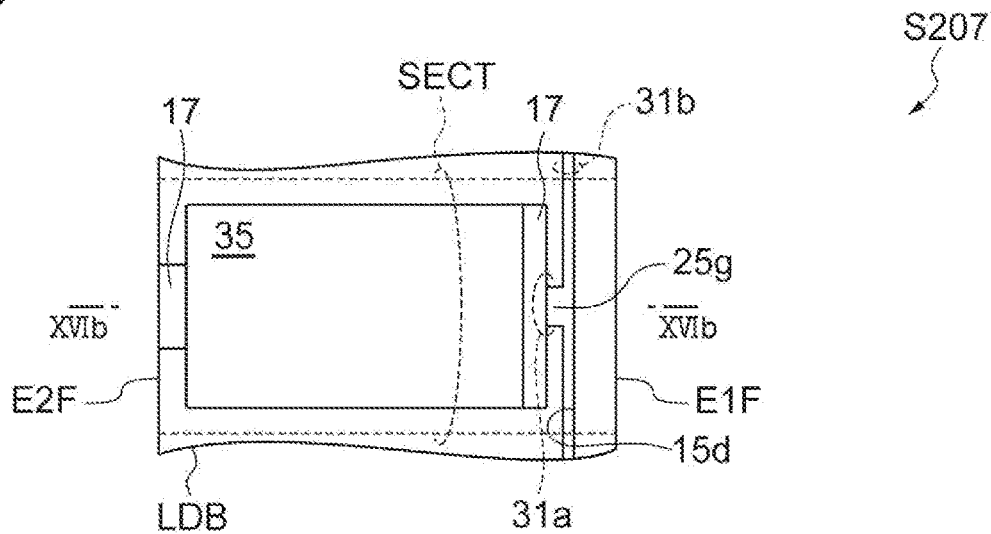
FIG. 16A is a schematic view showing a major step in the methods according to the other embodiment.
Figure 16B:
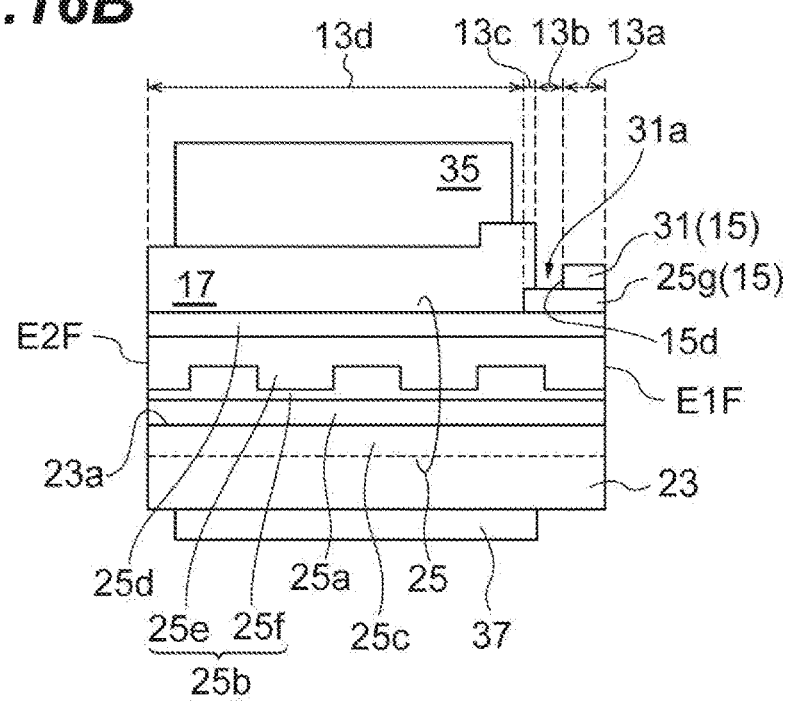
FIG. 16B is a schematic view showing a major step in the methods according to the other embodiment.
Figure 16C:
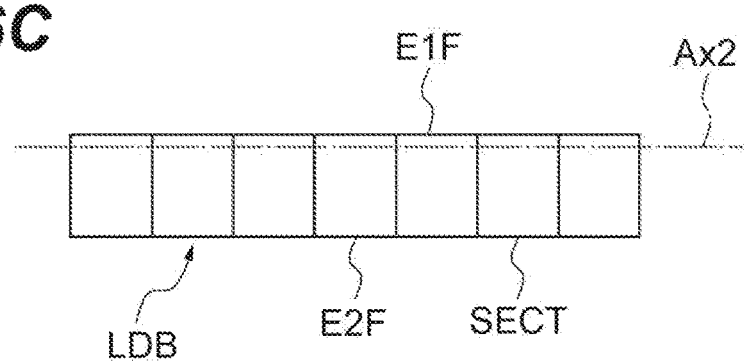
FIG. 16C is a schematic view showing a major step in the methods according to the other embodiment.

Step S207 will be described with reference to FIGS. 16A to 16C. FIG. 16A is a plan view showing a major step in the method according to the present embodiment. FIG. 16B is a cross sectional view taken along line XVIb-XIVb shown in FIG. 16A. FIG. 16C is a plan view showing a laser bar. Step S207 prepare a laser bar LDB. The laser bar LDB is fabricated by separating the substrate product along cleavage lines into the laser bar LDB having the first and second end faces E1F and E2F for the quantum cascade laser 11b. In the present embodiment, the first and second end faces E1F and E2F each have a cleavage face. The laser bar LDB includes an array of device sections SECT each for the quantum cascade laser 11b. The device sections SECT are arranged in the direction of the second axis Ax2. As shown in FIG. 2, each device section SECT includes a laser structure 13, a passivation film 31 (a high specific resistance region 15), and a metal layer 17, and further includes a thick electrode 35 and a backside metal layer 37. The laser structure 13 and the passivation film 31 extend continuously beyond the boundaries between the device sections SECT. The laser structure 13 has a first region 13a, a second region 13b, a third region 13c, and a fourth region 13d, which are sequentially arranged in the direction of the first axis Ax1. The first region 13a includes the first end face E1F, and the fourth region 13d includes the second end face E2F. The high specific resistance region 15 has a step 15d at the boundary between the second and third regions 13b and 13c. The step 15d extends continuously beyond the boundaries the devices sections SECT in the direction of the second axis Ax2. The high specific resistance region 15 is disposed on the first, second, and third regions 13a, 13b, and 13c. The metal layer 17 is disposed on the third and fourth regions 13c and 13d, and makes contact with the epi-surface of the fourth region 13d. The laser structure 13 includes a semiconductor substrate 23, a semiconductor mesa 25, and a cap layer 25g. The semiconductor mesa 25 is mounted on the principal surface 23a of the semiconductor substrate 23, and the cap layer 25g is mounted on the semiconductor mesa 25. The semiconductor mesa 25 includes a core layer 25a, and specifically, an upper semiconductor layer 25b, a lower semiconductor region 25c, and a contact layer 25d. The semiconductor mesa 25 extends in the direction of the first axis Ax1. In this embodiment, the laser structure 13 further includes an embedding region 27 embedding the semiconductor mesa 25 and the cap layer 25g.

After forming the dielectric film 19 and the metal reflective film 21 in order on the first end face E1F of the laser bar LDB, the laser bar LDB is separated into semiconductor ships each for a quantum cascade laser 11b. These steps can bring the quantum cascade laser 11b to completion.

Figure 17A:
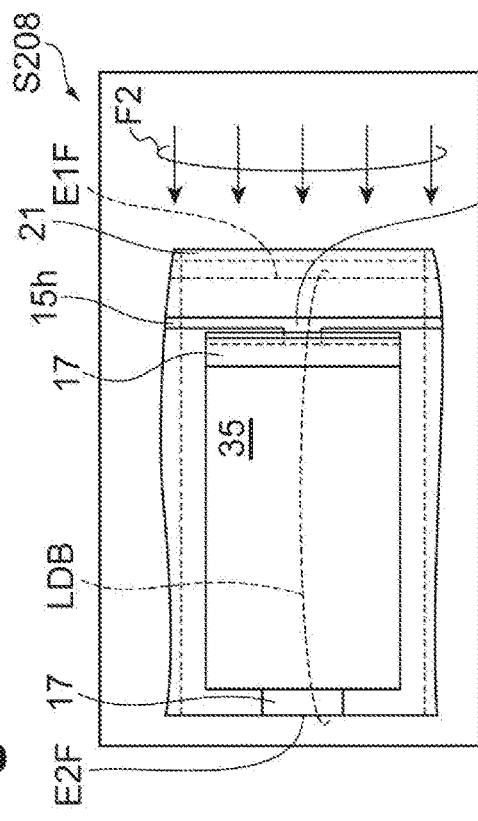
FIG. 17A is a schematic view showing a major step in the methods according to the other embodiment.
Figure 17B:
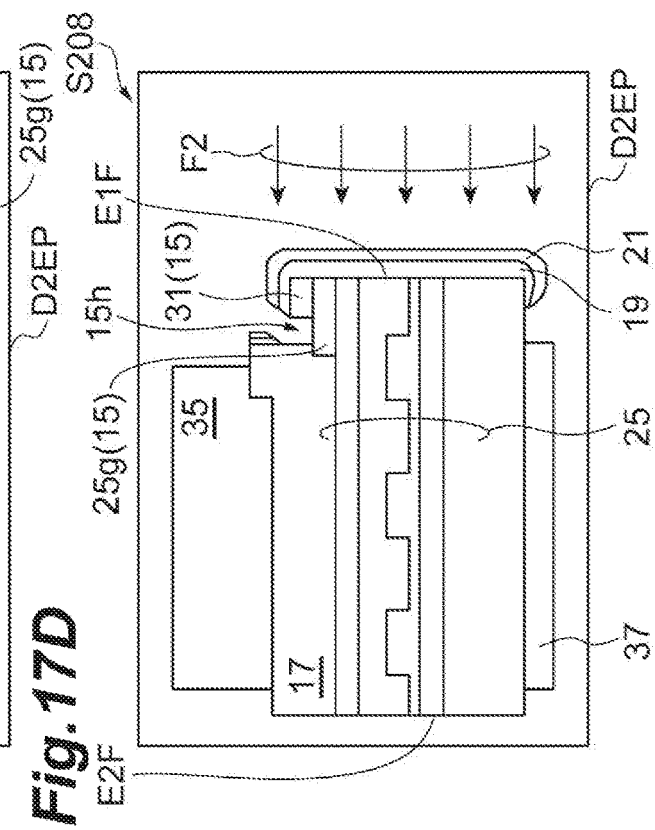
FIG. 17B is a schematic view showing a major step in the methods according to the other embodiment.
Figure 17C:
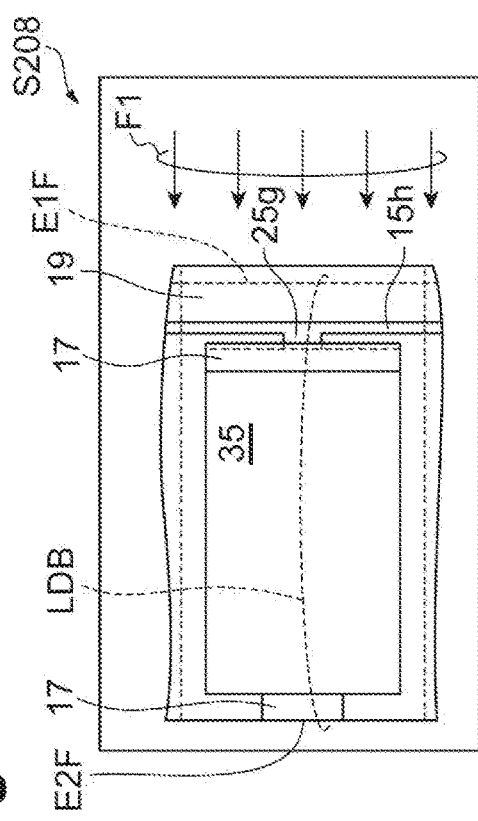
FIG. 17C is a schematic view showing a major step in the methods according to the other embodiment.
Figure 17D:
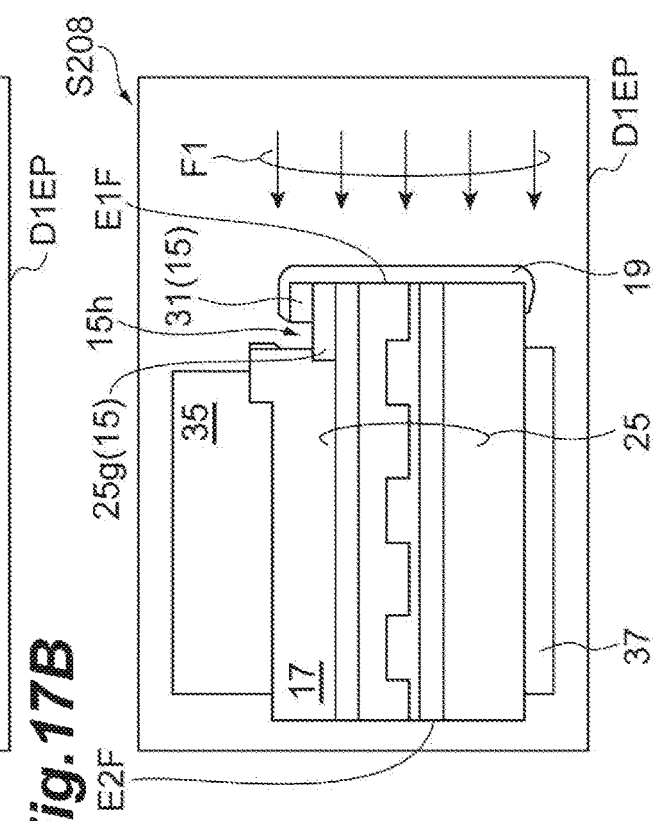
FIG. 17D is a schematic view showing a major step in the methods according to the other embodiment.

Step S208 will be described with reference to FIGS. 17A to 17D. FIGS. 17A and 17B are schematic views each showing a major step in the method according to the embodiment. FIGS. 17C and 17D are schematic views each showing a major step in the method according to the embodiment. In step S208, the dielectric film 19 and the metal reflective film 21 are formed in order on the first end face E1F of the laser bar LDB thus prepared. As shown in FIGS. 17A and 17B, the dielectric film 19 is formed on the first end face E1F of the laser bar LDB. In the present embodiment, the dielectric film 19 is deposited using the deposition apparatus D1EP. The deposition apparatus D1EP supplies the flux F1 of raw material for the dielectric film 19 to the first end face E1F. The flux F1 of raw material misses the first end face E1F aside to the upper and lower faces of the laser bar LDB, so that the deposited material for the dielectric film 19 is formed on the passivation film 31 and the metal layer 17 located on the upper face and extends continuously from the first end face E1F to the backside metal layer 37 on the lower face. The deposited material for the dielectric film 19 terminates at the difference in level 15d of the high specific resistance region 15 and the edge of the recess 15h. Thereafter, as shown in FIGS. 10C and 10D, the metal reflective film 21 is formed on the dielectric film 19 on the first end face E1F. In the present embodiment, the metal reflective film 21 is deposited using the deposition apparatus D2EP. The deposition apparatus D2EP supplies the flux F2 of raw material for the metal reflective film 21 to the first end face E1F. The material flux F1 misses the first end face E1F aside to the upper and lower faces of the laser bar LDB, so that deposited materials of the metal reflective film 21 are formed both on the passivation film 31 and the metal layer 17 on the epi-surface and extends continuously from the first end face E1F to on the backside metal layer 37 on the lower face. The deposited material of the metal reflective film 21 terminates at the difference in level 15d of the high specific resistance region 15 and the edge of the recess 15h.

As shown in FIG. 11A, the quantum cascade laser 11b is die-bonded. As seen from the description above with reference to FIG. 2, the quantum cascade laser 11b according to the present embodiment has the dielectric film 19 and the metal reflective film 21 which is in contact with solder material 45 in the die bonding step, on the first end face E1F and the metal layer 17, but has the thick electrode 35 and the conductive semiconductor of the semiconductor mesa 25 which are not in contact with solder material 45.

The method of fabricating the quantum cascade laser 11b can form the dielectric film 19 and the metal reflective film 21 on the first end face E1F. Deposited material for the dielectric film 19 is formed not only on the first end face E1F but also on the high resistance region 15 on the first region 13a (the passivation film 31) because during the film formation, the flux for the dielectric film 19 misses the first end face E1F aside to fly along the upper and lower faces of the laser bar LDB. Similarly, deposited material for the metal reflective film 21 is formed during film formation not only on the first end face E1F of the laser bar LDB but also on the high specific resistance region 15 (the passivation film 31) because the flux for the metal reflective film 21 misses the first end face E1F aside to fly along the first region 13a. The order of processes for forming the dielectric film 19 and the metal reflective film 21 provides the metal reflective film 21 on the dielectric film 19. Inventor's observations reveal that the deposited material for the dielectric film 19 has a small thickness on the high specific resistance region 15 on the first region 13 compared to on the first end face E1F of the laser bar LDB. In the high specific resistance region 15 on the laser bar LDB, the dielectric film 19 can space the metal reflective film 21 apart from the semiconductor of the laser bar LDB, and the terrace 15d of the laser bar LDB can separate the metal reflective film 21 apart from the metal layer 17.

The method for fabricating a semiconductor laser has major steps as follows: preparing a laser bar LDB having an array of device sections SECT; supplying the flux F1 of raw material for the dielectric film 19 to the first end face E1F of the laser bar LDB; and after the dielectric film 19 has been deposited, supplying the flux F2 of raw material for the metal reflective film 21 to the first end face E1F. The laser bar LDB includes a laser structure 13 and a high specific resistance region 15 provided on the first region 13a. The laser structure 13 includes a first region 13a with the first end face E1F, a second region 13b, a third region 13c, and a terrace 15d. Each of the device sections SECT includes a metal layer 17q disposed on the third region 13c of the laser structure 13. The first region 13a, the second region 13b, and the third region 13c are sequentially arranged in the direction of the first axis Ax 1 and extend in the direction of the second axis Ax2 intersecting with that of the first axis Ax1. The terrace 15d extends in the direction of the second axis Ax2 and is located at the boundary between the first and second regions 13a and 13b. The high specific resistance region 15 extends in the direction of the second axis Ax2.

The above description shows that the above embodiment can provide a quantum cascade laser with a structure capable of avoiding a short circuit via a metal reflective film on the end face. The light emitting device according to the above embodiment can include the quantum cascade laser. The method for fabricating a quantum cascade laser according to the above embodiment is provided which has a structure that can prevent the metal reflective film on an end face from causing short circuit therethrough.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A quantum cascade laser comprising:
a laser structure including a first region, a second region, and a third region, the first region having an end face;
a high-specific resistance region disposed on a principal surface of the first region and a principal surface of the second region;
a metal layer disposed on a principal surface of the third region;
a dielectric film disposed on the end face and the high-specific resistance region; and
a reflective metal film disposed on the dielectric film, the end face and the high-specific resistance region, wherein
the first region, the second region, and the third region are arranged in order in a direction of a first axis, the laser structure includes a semiconductor mesa and a semiconductor base, the semiconductor mesa having a core layer, and the semiconductor base mounting the semiconductor mesa, the high-specific resistance region has a terrace with a difference in level at a boundary between the first region and the second region, the terrace extending in a direction of a second axis intersecting the first axis, the laser structure further includes a fourth region, the first region, the second region, the third region, and the fourth region being arranged in order in the direction of the first axis, the high-specific resistance region has an inorganic insulating film on the laser structure, the high-specific resistance region layer has a strip-shaped opening on the semiconductor mesa and a principal surface of the fourth region, the metal layer is in contact with the fourth region through the strip-shaped opening, the inorganic insulating layer is disposed on the principal surface of the first region, the second region, and the third region, the high-specific, resistance region has a first portion and a second portion arranged in the direction of the first axis, the first portion and the second portion of the high-specific resistance region are disposed on the principal surface of the first region and the principal surface of the second region, respectively, the first portion of the high-specific resistance region has a first thickness, the second portion of the high-specific resistance region has a second thickness different from the first thickness, and the first portion and the second portion of the high-specific resistance region are adjoined to each other to form the terrace, the high-specific resistance region further has a third portion on the principal surface of the third region, the first portion, the second portion and the third portion of the high-specific resistance region extend in the direction of the second axis, the third portion of the high-specific resistance region has a third thickness different from the second thickness, and the second portion and the third portion of the high-specific resistance region are adjoined to each other to form a groove.

2. A quantum cascade laser comprising:
a laser structure including a first region, a second region, and a third region, the first region having an end face;
a high-specific resistance region disposed on a principal surface of the first region and a principal surface of the second region;
a metal layer disposed on a principal surface of the third region;
a dielectric film disposed on the end face and the high-specific resistance region; and
a reflective metal film disposed on the dielectric film, the end face and the high-specific resistance region, wherein
the first region, the second region, and the third region are arranged in order in a direction of a first axis,
the laser structure includes a semiconductor mesa and a semiconductor base, the semiconductor mesa having a core layer, and the semiconductor base mounting the semiconductor mesa, the high-specific resistance region has a terrace with a difference in level at a boundary between the first region and the second region, the terrace extending in a direction of a second axis intersecting the first axis, the laser structure further includes a fourth region, the first region, the second region, the third region, and the fourth region being arranged in order in the direction of the first axis, the high-specific resistance region has an inorganic insulating film on the laser structure, the high-specific resistance region layer has a strip-shaped opening on the semiconductor mesa and a principal surface of the fourth region, the metal layer is in contact with the fourth region through the strip-shaped opening, the high-specific resistance region further includes a high-specific resistance semiconductor layer, the high-specific resistance semiconductor layer is disposed between the laser structure and the inorganic insulating layer, the inorganic insulating layer has an edge extending on the high-specific resistance semiconductor layer, and the difference in level is formed by the edge of the inorganic insulating layer.

3. The quantum cascade laser according to claim 2, wherein
the high-specific resistance semiconductor layer is disposed on the principal surface of the first region, the second region and the third region, and
the high-specific resistance semiconductor layer is in contact with the metal layer through the strip-shaped opening.

4. The quantum cascade laser according to claim 2, wherein the high-specific resistance semiconductor layer includes at least one of semi-insulating and undoped semiconductors.

5. A light emitting apparatus comprising:
a quantum cascade laser;
a supporting base mounting the quantum cascade laser; and
a solder material fixing the quantum cascade laser to the supporting base,
the quantum cascade laser including:
a laser structure including a first region, a second region, and a third region, the first region having an end face;
a high-specific resistance region disposed on a principal surface of the first region and a principal surface of the second region;
a metal layer disposed on a principal surface of the third region;
a dielectric film disposed on the end face and the high-specific resistance region; and
a reflective metal film disposed on the dielectric film, the end face and the high-specific resistance region,
in the quantum cascade laser,
the first region, the second region, and the third region being arranged in order in a direction of a first axis,
the laser structure including a semiconductor mesa and a semiconductor base, the semiconductor mesa having a core layer, and the semiconductor base mounting the semiconductor mesa,
the high-specific resistance region having a wall providing a difference in level at a boundary between the first region and the second region, the wall extending in a direction of a second axis intersecting the first axis from one side of the high-specific resistance region to another side thereof, wherein the metal layer is disposed on a top face of the high-specific resistance region, and the high-specific resistance region is in direct contact with an epi-face of the laser structure in the first and the second region.

6. The light emitting apparatus according to claim 5, wherein the quantum cascade laser further includes a back metal layer disposed on a back face of the laser structure, the back face is opposite to the principal surface, the dielectric film and the reflective metal film extend to the back face of the first region and are disposed on the back face of the first region, and the solder material is in direct contact with the back metal layer and the reflective metal film.

7. A quantum cascade laser comprising:

a laser structure including a first region, second region, and a third region, the first region having an end face;

a high specific resistance region disposed on a principal surface of the first region and a principal surface of the second region;

a metal layer disposed on a principal surface of the third region;

a dielectric film disposed on the end face and the high-specific resistance region; and a reflective metal film disposed on the dielectric film, the end face and the high-specific resistance region, the first region, the second region, and the third region being arranged in order in a direction of a first axis, the laser structure including a semiconductor base mounting the semiconductor mesa, and the high-specific resistance region having a wall providing a difference in level at a boundary between the first region and the second region, the wall extending in a direction of a second axis intersecting the first axis from one side of the high-specific resistance region to another side thereof, wherein the metal layer is disposed on a top face of the high-specific resistance region.

8. The quantum cascade laser according to claim 7, further comprising a back metal layer disposed on a back face of the laser structure, wherein the back metal layer is away from the end face, and the back face of the :laser structure is opposite to the principal surface.

9. A quantum cascade laser comprising:

a laser structure including a first region, second region, and a third region, the first region having an end face;

a high specific resistance region disposed on a principal surface of the first region and a principal surface of the second region;

a metal layer disposed on a principal surface of the third region;

a dielectric film disposed on the end face and the high-specific resistance region; and a reflective metal film disposed on the dielectric film, the end face and the high-specific resistance region, the first region, the second region, and the third region being arranged in order in a direction of a first axis, the laser structure including a semiconductor base mounting the semiconductor mesa, and the high-specific resistance region having a wall providing a difference in level at a boundary between the first region and the second region, the wall extending in a direction of a second axis intersecting the first axis from one side of the high-specific resistance region to another side thereof, wherein the high-specific resistance region is in direct contact with an epi-face of the laser structure in the first and second regions.

10. The quantum cascade laser according to claim 9, further comprising a back metal layer disposed on a back face of the laser structure, wherein the back metal layer is away from the end face, and the back face of the laser structure is opposite to the principal surface.

* * * * *